(12) United States Patent
Shukuri

(10) Patent No.: US 6,529,407 B2
(45) Date of Patent: Mar. 4, 2003

(54) SEMICONDUCTOR DEVICE WITH IMPROVED LATCH ARRANGEMENT

(75) Inventor: Shoji Shukuri, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/880,227

(22) Filed: Jun. 14, 2001

(65) Prior Publication Data

US 2002/0191438 A1 Dec. 19, 2002

(30) Foreign Application Priority Data

Jun. 14, 2001 (JP) ........................................ 2000-184528

(51) Int. Cl.[7] .............................................. G11C 16/04
(52) U.S. Cl. ............................ 365/185.07; 365/185.08; 365/154
(58) Field of Search ..................... 365/185.07, 185.08, 365/154

(56) References Cited

U.S. PATENT DOCUMENTS

| | | | |
|---|---|---|---|
| 5,440,159 A | 8/1995 | Larsen et al. | |
| 5,457,335 A | 10/1995 | Kuroda et al. | |
| 5,504,706 A | 4/1996 | D'Arrigo et al. | |
| 5,767,544 A | 6/1998 | Kuroda et al. | |
| 5,912,841 A | 6/1999 | Kim | |
| 5,986,932 A | * 11/1999 | Ratnakumar et al. | .. 365/185.07 |
| 6,064,606 A | 5/2000 | Kuroda et al. | |
| 6,141,248 A | * 10/2000 | Forbes et al. | .......... 365/185.08 |

FOREIGN PATENT DOCUMENTS

| | | |
|---|---|---|
| JP | 4-212471 | 8/1992 |
| JP | 5-314789 | 11/1993 |
| JP | 6-76582 | 3/1994 |
| JP | 10334691 | 12/1998 |

OTHER PUBLICATIONS

Ohsaki et al., "A Single Poly EEPROM Cell Structure for Use in Standard CMOS Processes", IEEE, 1994, pp. 311–316.

* cited by examiner

Primary Examiner—Huan Hoang
(74) Attorney, Agent, or Firm—Antonelli, Terry, Stout & Kraus, LLP

(57) ABSTRACT

The nonvolatile memory includes a nonvolatile memory circuit that possesses a pair of series circuits of load elements and nonvolatile memory transistors, which are connected in a static latch configuration, a program control circuit that writes information into the nonvolatile memory circuit, a volatile latch circuit that latches information read from the nonvolatile memory circuit, and a readout control circuit that makes the volatile latch circuit latch the information read from the nonvolatile memory circuit. In response to the instruction of the readout operation, the readout control circuit supplies the operating voltage for the static latch operation to the nonvolatile memory circuit, and stops the supply of the operating voltage, after completing the latch operation.

37 Claims, 23 Drawing Sheets

FIG. 3

|         | VDL  | VDR  | VDD    | VGG |
|---------|------|------|--------|-----|
| WRITING | 5V   | 0V   | 5V     | 5V  |
| ERASING | open | open | open   | 5V  |
| READING | open | open | 0→1.8V | 0V  |
| STANDBY | 0V   | 0V   | 0V     | 0V  |

FIG. 10

|  | VPL | VDL | VDR | VPR | VDD | VSS |
|---|---|---|---|---|---|---|
| WRITING | 0V | 5V | 0V | 5V | 0V | 0V |
| ERASING | 5V | open | 5V | open | open | open |
| READING | open | open | open | open | 0→1.8V | 0V |
| STANDBY | 0V | 0V | 0V | 0V | 0V | 0V |

35-BIT FUSE MODULE BLOCK

US 6,529,407 B2

SEMICONDUCTOR DEVICE WITH IMPROVED LATCH ARRANGEMENT

BACKGROUND OF THE INVENTION

The present invention relates to a semiconductor device having electrically erasable and rewritable nonvolatile memory transistors; and, more specifically, the invention relates to a technique that is applicable to a semiconductor device having nonvolatile memories, which uses flip-flops (nonvolatile memory circuits) including plural nonvolatile memory transistors as a storage unit.

A flash EEPROM memory has been provided as a nonvolatile memory, which is capable of electrically erasing data as well as electrically writing data collectively in a specific unit, which memory is hereunder referred to as a flash memory. The flash memory has memory cells configured with electrically erasable and writable nonvolatile memory transistors, which memory is capable of erasing data and programs that are written temporarily in memory cells and rewriting new data and programs in the memory cells.

Therefore, after integrating the flash memory or a microcomputer containing the flash memory into an application system, when modifications of data, corrections of bugs in a program, and updates of the program, and the like become necessary, the data and programs stored in the flash memory can be modified on the application system, which accordingly achieves a reduction of the development term of the application system and gives flexibility to the program development of the application system.

Recently, on the other hand, a system semiconductor device has been provided, in which a central processing unit (Hereunder, also referred to as a CPU) operating as a data control device, a DRAM (Dynamic Random Access Memory) serving as a large scale memory, an SRAM (Static Random Access Memory) serving as a high speed memory or a cache memory, and other functional circuits are integrally formed on one semiconductor substrate (hereunder, also referred to as a system LSI), whereby one semiconductor device can form one complete system. This type of system LSI contributes to a size reduction of a PCB and a packaging substrate, and exhibits a significant effect in miniaturization and weight reduction of portable equipment, such as portable telephones, portable data terminals, and the like.

The inventors of the present invention have examined the prior art from the following aspect A and aspect B.

The aspect A involves provision of nonvolatile memory transistors with single layer polysilicon gates, and the aspect B involves the use of flip-flops, including the nonvolatile memory transistors, as a storage unit.

As a result, the inventors have discovered, with regard to aspect A, the U.S. Pat. No. 5,440,159, the U.S. Pat. No. 5,504, 706, Japanese Unexamined Patent Publication No. Hei 4 (1992)-212471 (corresponding to U.S. Pat. No. 5,457, 335), and a thesis by Osaki et al. on "A single poly EEPROM Cell Structure for use in Standard CMOS Processes" published in the IEEE Journal of Solid-state Circuits, VOL. 29, No.3, March 1994, pp311–316.

On the other hand, the inventors discovered, with regard to aspect B, Japanese Unexamined Patent Publication No. Hei 5(1993)-314789, Japanese Unexamined Patent Publication No. Hei 6(1994)-76582, and Japanese Unexamined Patent Publication No. Hei 10(1998)-334691 (corresponding to U.S. Pat. No. 5,912,841). The Japanese Unexamined Patent Publication No. Hei 5(1993)-314789 discloses a technique in which two electrically rewritable nonvolatile memory (EPROM) transistors are constructed by using flip-flops composed of a drive transistor and two load transistors as a storage unit, and in which redundant addresses of a relief circuit are stored.

SUMMARY OF THE INVENTION

The inventors' examination of the foregoing documents revealed the following points. First of all, the first problem discovered by the inventors was that, in the flip-flop circuit composed of the drive transistor (nonvolatile memory transistor) and the two load transistors, as disclosed in the Japanese Unexamined Patent Publication No. Hei 5(1993)-314789, the initial threshold voltage in which the floating gates do not hold any charges at all, the threshold voltage in the writing/erasing state, and the word line potential in reading greatly influence the rate of occurrence of readout errors resulting from a deterioration of the charge holding characteristics.

FIG. 25 shows a flip-flop circuit including the nonvolatile memory transistor that the inventors examined, illustrating a state in which writing is executed to one nonvolatile memory transistor 223, and, thereafter, the reading is executed by applying the supply voltage Vcc to the supply line. In FIG. 25, reference numerals 220 and 221 denote a p-channel load transistor; and reference numerals 222 and 223 denote an n-channel nonvolatile memory transistor. Since the one transistor 222 of the two nonvolatile memory transistors has the initial threshold voltage (VthL) and the other transistor 223 has the high threshold voltage (VthH), while the potential of the power supply line rises from 0 Volt to the power supply voltage Vcc, the latch is locked; and, accordingly, Vcc (H level) is applied to the drain of the nonvolatile memory transistor 223 having the high threshold voltage (VthH) and to the gate of the nonvolatile memory transistor 222 having the initial threshold voltage (VthL) acting as the so-called disturbing voltage. In this state of disturbance, a stress acts in a direction such that the charges stored in the floating gate of the nonvolatile memory transistor 223 having the high threshold voltage (VthH) are pulled out toward the drain terminal; on the other hand, a stress acts in the direction such that the charges are poured into the floating gate of the nonvolatile memory transistor 222 having the initial threshold voltage (VthL). Since the semiconductor device is designed on the premise that it operates continuously for ten years, it has to be considered that the stresses which act on the nonvolatile memory transistors 222, 223 are applied continuously for ten years. Therefore, the rise of the threshold voltage in the nonvolatile memory transistor 222 having the initial threshold voltage (VthL), namely the charge gain, and the fall of the threshold voltage in the nonvolatile memory transistor 223 having the high threshold voltage (VthH), namely the charge loss, occur at the same time. In case a gate oxide film is made thin, the threshold voltages of the two nonvolatile memory transistors 222, 223 approach an equal value comparably easily, and it is believed that a readout error occurs due to a conversion of latched data. Thus, the inventors discovered that the flip-flop circuit with the supply voltage Vcc always applied as shown in FIG. 25 is not resistant to the disturbing voltage.

The second problem discovered by the inventors is that, in the vertically stacked-structure comprising memory cells of the floating gates and the control gates, namely the stacked gate memory cells, the complicated memory cell structure increases the manufacturing cost. Especially, in the so-called system LSI product that incorporates the flash memory, which has experienced rapid growth in the market in recent years, together with high-speed logic circuits, a DRAM, and the like, the application of the stacked memory cells to the flash memory leads to an increase in the manufacturing cost. The investigation by the inventors finds that this is caused by an increase in the number of photo masks and the manufacturing processes. That is, the tunnel oxide film of a flash memory is thicker than the gate oxide film of a logic circuit transistor or the gate oxide film of a DRAM cell transistor. This requires a mask for separately manufacturing a tunnel oxide film, a mask for adding a polysilicon film for the floating gate of the flash memory, a mask for processing word lines of the flash memory, an impurity injection mask for forming a drain region of the flash memory, and the impurity injection mask for forming a low density N-type source/drain region and a low density P-type source/drain region for high withstand voltage transistors constituting a write/erase circuit; therefore, the number of masks to be added amounts to six at the lowest. Accordingly, it becomes difficult to provide a low-priced system LSI that incorporates a flash memory using stacked gate memory cells in terms of the cost. In order to solve this problem it is necessary to form the nonvolatile memory transistors with a single layer polysilicon gate structure.

However, in regard to the gate oxide film thickness of the nonvolatile memory transistors which have a layer polysilicon gate structure, it is advisable to examine the relation with the gate oxide film thickness of the MIS transistors in the other circuits, which are incorporated together with the nonvolatile memory transistors. The inventors' examination indicates that the limit of the rewrite frequency in the nonvolatile memory transistor has a correlation with the gate oxide film thickness, and the gate oxide film thickness should be made thick to delay the deterioration of the data holding performance. However, in order to not complicate the manufacturing processes of the semiconductor integrated circuit, it is advisable to form the gate oxide film of the nonvolatile memory transistors having the single layer gate structure and the gate oxide film of the MIS transistors in the other circuits so that they have the same thickness.

The inventors further examined the aspects of using a plurality of the nonvolatile memory transistors single layer polysilicon gate structure in series connection, halting the application of the voltage to the nonvolatile memory transistors directly after reading the nonvolatile memory transistors which have the single layer polysilicon gate structure, holding data read out from the nonvolatile memory transistors by a volatile data latch circuit, and processing the data held by the data latch circuit by an error-correcting code (ECC) circuit, etc. In regard to these proposals, there was not any disclosure in the documents found in the above investigation of the prior art.

An object of the present invention is to enhance the data holding performance of the nonvolatile memory transistors connected in a static latch configuration over a long period of time.

Another object of the invention is to simplify the device structure of the nonvolatile memory transistors connected in the static latch configuration.

Another object of the invention is to provide a semiconductor device incorporating a nonvolatile memory that remarkably lowers the rate of occurrence of readout errors, without adding an entirely new process to the normal logic circuit process or the general purpose DRAM process.

Another object of the invention is to provide a technique that uses the nonvolatile memory transistors configured with single layer polysilicon gates for the relief circuit of a memory module or a memory circuit.

The foregoing and other objects and novel features of the invention will become apparent from the following descriptions and the accompanying drawings.

Typical aspects and features of the invention disclosed in this application will be outlined briefly as follows.

[1] The first aspect of the invention is to read out information stored in the nonvolatile memory transistors connected in static latch configuration, such as a flip-flop (self-latch), thereafter immediately stop application of the operating voltage to the nonvolatile memory transistors, and shorten the period of the voltage applied, so as to enhance the information holding performance over a long term.

That is, the nonvolatile memory formed on a semiconductor substrate includes plural nonvolatile memory circuits that include a pair of series circuits of load elements and nonvolatile memory transistors, which are connected in a static latch configuration; a program control circuit that writes information into the nonvolatile memory circuits; a volatile latch circuit that operates to latch information read from the nonvolatile memory circuits; and a readout control circuit that controls the volatile latch circuit to latch the information read from the nonvolatile memory circuits.

As long as the operating supply voltage is inputted, the volatile latch circuit holds the information read from the nonvolatile memory circuits. In this state, the nonvolatile memory circuits are not needed to maintain the static latch operation. Thereafter, it is beneficial to stop the supply of the operating voltage for the static latch operation by the nonvolatile memory transistors.

Preferably, the readout control circuit adopts an automatic power-off function. For example, the readout control circuit supplies the operating supply voltage for the static latch operation to the nonvolatile memory circuits in response to the instruction for a reading operation, and stops the supply of the operating supply voltage, after the volatile latch circuit completes the latch operation in response to the static latch operation.

This makes it possible to avoid a useless voltage application to the nonvolatile memory transistors, which shortens the period during which the nonvolatile memory transistors are exposed uselessly to the voltages that create the charge gain and the charge loss, thereby enhancing the information holding performance over a log term.

The nonvolatile memory circuit is used for the storage of relief information for relieving defective circuit portions. It is advisable to give the instruction of the reading operation in response to the reset instruction to the semiconductor device, when there presumably exists information that has to already be reflected to the functions of the internal circuits, in a stare that the semiconductor device is operable as with the relief information.

And, assuming that there exists information that is indispensable for the normal operation of the semiconductor device, such as the relief information, it is recommendable to add an ECC circuit that accepts the information latched by the volatile latch circuit and implements error corrections, in order to further enhance the long-term reliability of the information stored in the nonvolatile memory circuit.

[2] The basic circuit configuration for the self-latch operation preferably adopts a pair of nonvolatile memory transistors as the drive transistor. That is, the nonvolatile memory circuit operating as the self-latch is configured with a first conductive type transistor having a source, drain, and gate as the load, and a second conductive type nonvolatile memory transistor having a source, drain, floating gate, and control gate. The series circuit of the load and the nonvolatile memory transistor have an output node to couple the load transistor with the nonvolatile memory transistor and a control node to couple the gate of the load transistor witb the control gate of the nonvolatile memory transistor. The output node of one series circuit is mutually connected to the control node of the other series circuit to form the static latch configuration, and complementary data lines are connected to the output nodes of both of the series circuits.

The programming of a pair of nonvolatile memory transistors in the nonvolatile memory circuit is arranged, for example, to supply complementary voltages to the complementary data lines and inject hot electrons into the floating gate of one nonvolatile memory transistor. In the reading operation of the nonvolatile memory circuit, the static latch operation in accordance with the threshold voltage difference of a pair of the nonvolatile memory transistors by supplying the operating supply voltage to a pair of the series circuit with a specific speed acquires complementary signals on the complementary data lines.

[3] The self-latch preferably adopts a series connection configuration of the nonvolatile memory transistors, in order to enhance or improve the information holding performance. That is, the nonvolatile memory circuit is configured with the first conductive type transistor equipped with a source, drain, and gate as the load, and the second conductive type nonvolatile memory transistor equipped with a source, drain, floating gate, and control gate. The series circuit of the load transistor and the non-volatile memory transistor possesses an output node to couple the load transistor with the non-volatile memory transistor, a program node to connect another nonvolatile memory transistor in series to the non-volatile memory transistor coupled with the output node, and a control node to commonly couple the gate of the load transistor and the control gate of the nonvolatile memory transistor. A pair of the series circuits has a static latch configuration in which the output node of one series circuit is mutually connected to the control node of the other series circuit, complementary data lines are connected to the output nodes of both of the series circuits, and complementary program control lines are connected to the program nodes of both of the series circuits.

The programming of a pair of the nonvolatile memory transistors in the nonvolatile memory circuit is arranged, for example, to supply complementary voltages to the complementary program control lines and inject hot electrons into the floating gates of both the nonvolatile memory transistors of one series circuit. In the reading operation of the non-volatile memory circuit, the static latch operation in accordance with the threshold voltage difference of the nonvolatile memory transistors between a pair of the series circuits by supplying the operating supply voltage to a pair the series circuit with a specific speed acquires complementary signals on the complementary data lines. In case of the nonvolatile memory transistors each having gate insulating films of equal thickness, the probability that the floating gate emits hot electrons by the charge loss to thereby invert the threshold voltage state decreases with two transistors in series, compared with one. Therefore, the series configuration of plural nonvolatile memory transistors makes it possible to enhance or improve an insufficient information holding performance in terms of the gate insulating film thickness of the nonvolatile memory transistors.

[4] The second aspect of the invention lies in the single layer polysilicon gate structure of the nonvolatile memory transistor. That is, the nonvolatile memory transistor preferably includes a MIS transistor having the second conductive type source and drain formed in the first conductive type semiconductor region, a gate insulating film formed on a channel between the source and the drain, and a floating gate formed on the gate insulating film, and a control gate formed in the second conductive type semiconductor region, underlying a gate insulating film formed beneath an extended portion of the floating gate.

The thickness of the gate insulating film of the nonvolatile memory transistor is preferably determined in consideration of the necessary withstand voltage and the relation of the gate insulating film thickness with the other circuits. For example, it is recommendable to employ a high voltage operational MIS transistor having a comparably thick gate insulating film for the MIS transistors contained in the nonvolatile memory circuit and the program control circuit (the term MIS transistor used in this specification is a generic name for the insulated-gate field-effect transistor), and to employ a low voltage operational MIS transistor having a comparably thin gate insulating film to the MIS transistors contained in the volatile latch circuit and the readout control circuit.

When a logic circuit and an external interface circuit each having the MIS transistors are included on the semiconductor substrate, the external interface circuit employs a comparably thick gate insulating film for increasing the static withstand of the input MIS transistors connected to the external terminal. On the other hand, in the semiconductor integrated circuit that steps down the operating supply voltage, such as 3.3 volts supplied from outside, and uses the stepped down voltage as the operating voltage for the internal circuit, such as the logic circuit, the MIS transistors for the external interface circuit that operate by receiving 3.3 volts have a thick gate insulating film, compared to those of the MIS transistors for the internal circuit. In consideration of this point, it is advisable to set the gate insulating film thickness of the nonvolatile memory transistors and that of the MIS transistors contained in the external interface circuit into a substantially equal thickness (within the allowance due to the process dispersion). In other words, the gate insulating film of the MIS transistors for the nonvolatile memory transistors and the gate insulating film of the MIS transistors contained in the external interface circuit are only needed to be manufactured at the same time, with one and the same process or with a common photo-mask.

Thus, the arrangement to make the gate insulating film thickness of the nonvolatile memory transistors having the single layer gate structure and the gate insulating film thickness of the MIS transistors in the other circuits into one uniform thickness achieves a long-term information holding performance for the nonvolatile memory circuit, while not complicating the manufacturing process of the semiconductor device.

In view of the manufacturing process capable of forming the nonvolatile memory elements, such as the single layer polysilicon process, the floating gates of the MIS Transistors constituting the nonvolatile memory transistor, the gates of the MIS transistors contained in the logic circuit, the gates of the MIS transistors contained in the external interface circuit, and the gates of the MIS transistors contained in the DRAM are preferably formed with an equal thickness within the allowance due to the process dispersion. That is, an employment of the single gate process, such as the single polysilicon process, will provide a semiconductor integrated circuit that incorporates a nonvolatile memory that has an excellent data holding performance together with DRAM and so forth, such as a system LSI.

[5] The third aspect is a memory circuit for relief information as a use of the nonvolatile memory. Here, the semiconductor device includes a to-be-relieved circuit and a relief circuit that replaces the to-be-relieved circuit on the substrate, and the nonvolatile memory circuit is used as a memory circuit for holding relief information that specifies the to-be-relieved circuit to be replaced by the relief circuit.

The semiconductor device may be provided with a fuse programming circuit that stores the relief information in accordance with a fusing state of a fuse element, as another circuit to store the relief information for the relief circuit. The combined use of the fuse programming circuit for the relief of defects detected on the wafer stage and the programming circuit for the relief of the defects detected after the burn-in makes it possible to improve the relief efficiency, in other words, to enhance the yield of the semiconductor device. The use of the fuse programming circuit only cannot relieve the defects after the burn-in. The use of the electrical programming circuit only will enlarge the circuit scale or the chip area.

The to-be-relieved circuit may be a memory cell array with a DRAM built in. Or, the to-be-relieved circuit may be a memory cell array of a microcomputer built-in DRAM. Or, the to-be-relieved circuit may be a memory cell array of a microcomputer built-in SRAM.

[6] In order to ultimately reduce the readout defect rate, the semiconductor device may be configured so as to make a part of the plural nonvolatile memory circuits hold error correction codes in relation to the relief information held by the remaining nonvolatile memory circuits, and to provide an ECC circuit capable of error corrections in relation to the readout information of the plural nonvolatile memory circuits.

The guarantee of the error correction function by the ECC circuit may be achieved by providing the program control circuit with a write-in inhibit mode to the nonvolatile memory circuit.

BRIEF DESCRIPTION OF THE DRAWINGS

FIG. 3 is a chart illustrating the state of voltages in writing, erasing, reading, and standby status in relation to a nonvolatile memory transistor;

FIG. 10 is a illustrating the state of voltages in writing, erasing, reading, and standby status in relation to the nonvolatile memory transistor illustrated in FIG. 9;

DETAILED DESCRIPTION

Flip-Flop Type Nonvolatile Memory

Figure 1:
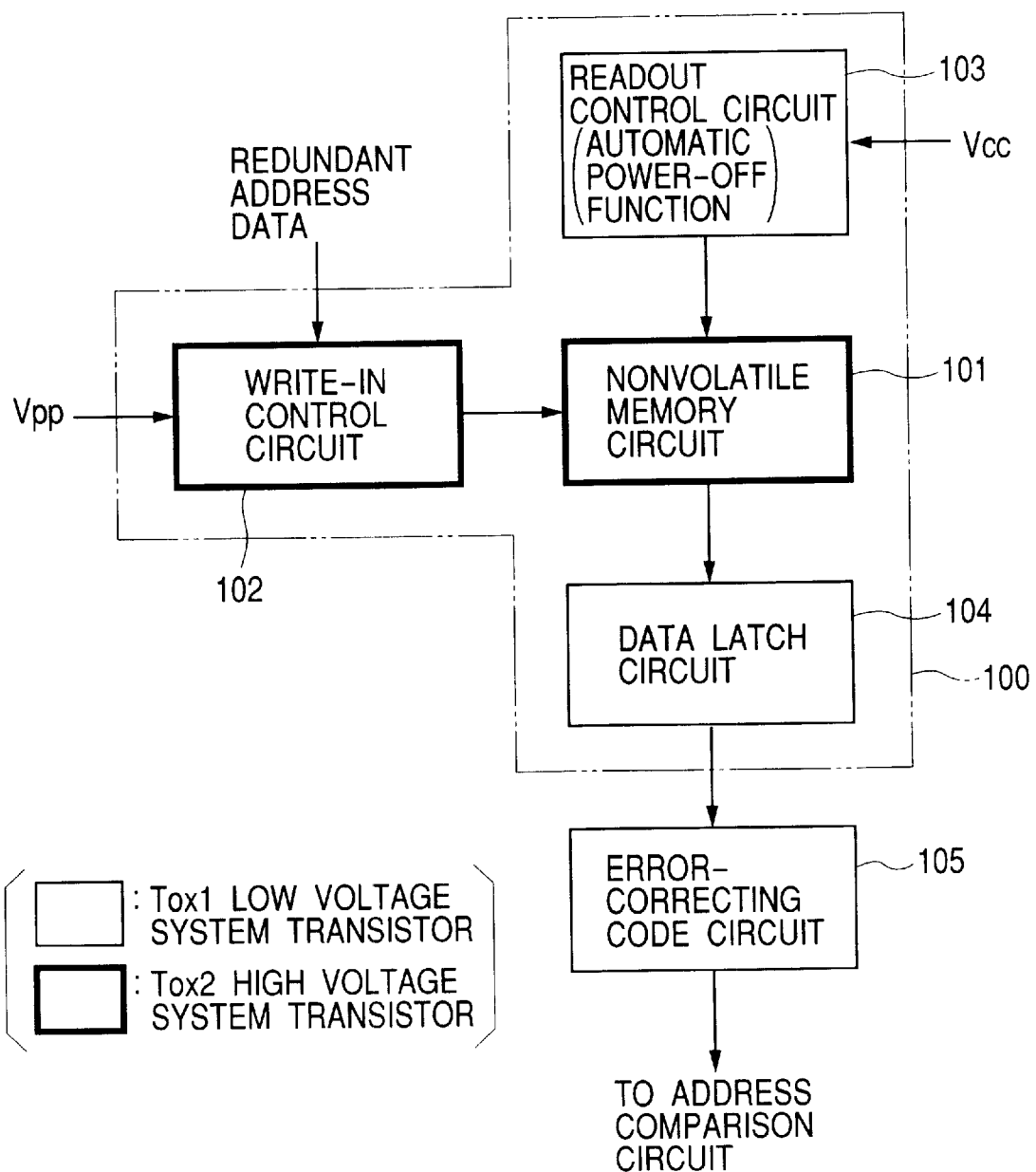
FIG. 1 is block diagram illustrating one example of a semiconductor device for a nonvolatile memory to the present invention, which is configured as a memory circuit for holding relief information.

FIG. 1 illustrates one example of a semiconductor device relating to the present invention, in which a non-volatile memory is configured as a memory circuit for holding relief information. The nonvolatile memory 100 shown in the drawing is formed on one semiconductor substrate integrally with a to-be-relieved circuit, which is not illustrated, and a relief circuit, which is also not illustrated, that replaces the to-be-relieved circuit. The non-volatile memory 100 includes a nonvolatile memory circuit 101, a program control circuit (write-in control circuit) 102, a readout control circuit 103, a volatile latch circuit (data latch circuit) 104, and an error-correcting code (ECC) circuit 105.

The nonvolatile memory circuit 101 stores relief information (for example, redundant address data) that specifies a to-be-relieved circuit to be replaced by the relief circuit. The program control circuit (write-in control circuit) 102 causes the nonvolatile memory circuit 101 to store the redundant address data. The volatile latch circuit data latch circuit) 104 is able to latch the information that the nonvolatile memory circuit 101 stores. The latched information is supplied to the ECC circuit 105, where errors are corrected if any, which information is supplied to an address comparison circuit, which is not illustrated, for effecting control to replace the to-be-relieved circuit by the relief circuit. The readout control circuit 103 executes the readout control that causes the data latch circuit 104 to latch the information read from the nonvolatile memory circuit 101.

The semiconductor device incorporating the nonvolatile memory 100 is formed by the MIS (metal insulated semiconductor) type semiconductor integrated circuit manufacturing technique, and the nonvolatile memory circuit 101 that requires a high voltage for writing the information and the write-in control circuit 102 that controls the nonvolatile memory circuit 101 are formed at least by a high voltage operational MIS transistor (high voltage system transistor). On the other hand, the readout control circuit 103, the data latch circuit 104, and the ECC circuit 105 can be formed by a low voltage operational MIS transistor (low voltage system transistor) capable of operating at a lower voltage than the above high voltage system transistor. However, in that case, a separating switch becomes necessary, which prevents the high voltage from being transmitted to the data latch circuit 104. When the readout control circuit 103 has to output a high voltage in writing, the readout control circuit 103 also needs to be configured by a high voltage system transistor. The gate insulating film of the high voltage system transistor Tox2 is made thicker than the gate insulating film of the low voltage system transistor Tox1.

First Example of Flip-Flop Type Nonvolatile Memory Circuit

Figure 2:
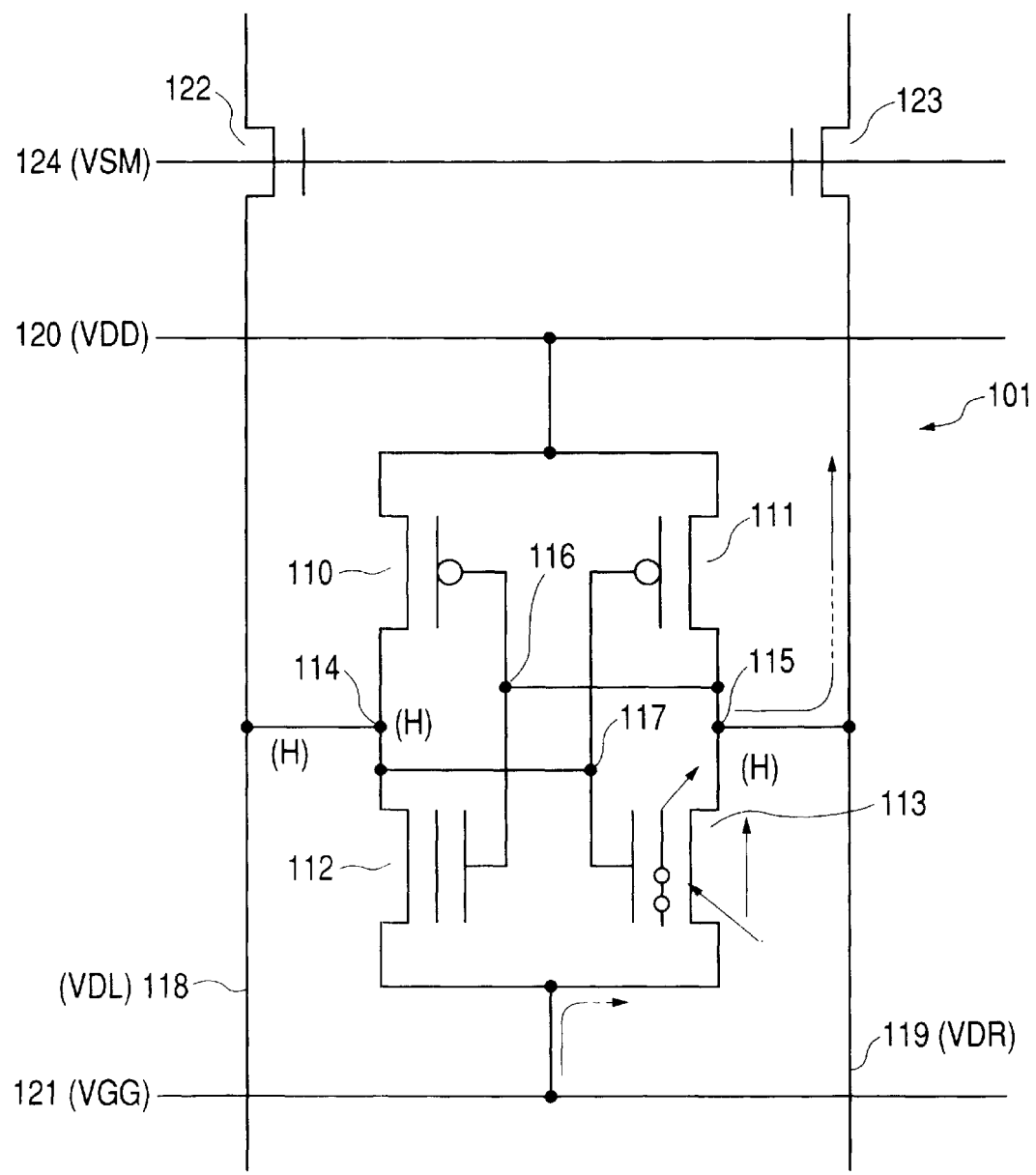
FIG. 2 is a circuit diagram illustrating one example of a nonvolatile memory circuit.

FIG. 2 illustrates one example of the nonvolatile memory circuit. The nonvolatile memory circuit 101 has a pair of series circuits consisting of load and nonvolatile memory transistors. In FIG. 2, the load transistors are the first conductive (for example, p-channel) MIS transistors 110, 111 having a source, drain, and gate; and the nonvolatile memory transistors are the second conductive (n-channel) transistors 112, 113 having a source, drain, floating gate, and control gate. The load MIS transistors 110, 111 are coupled to the nonvolatile memory transistors 112, 113, and the coupling points are referred to as the output nodes 114, 115. The load MIS transistors 110, 111 have their gates coupled to the control gates of the nonvolatile memory transistors 112, 113, and the coupling points are referred to as the control nodes 116, 117; and the output node 114 (115) of the one series circuit is mutually connected to the control node 117 (116) of the other series circuit, thus forming a static latch configuration. Complementary data lines 118, 119 are each connected to the output nodes 114, 115 in both the series circuits. The load MIS transistors 110, 111 have their sources connected to a wiring 120, and the nonvolatile memory transistors 112, 113 have their sources connected to a wiring 121. On the complementary data lines 118, 119, n-channel type write-in switch MIS transistors 122, 123 are controlled and switched by the signal voltage VSM of a wiring 124. The MIS transistors 122, 123 are turned ON during the write-in operation, and are OFF otherwise.

FIG. 3 illustrates the state of voltages in writing erasing, reading, and standby in relation to the nonvolatile memory circuit 101, which shows a case in which the nonvolatile memory transistor 113 laid out right in the nonvolatile memory circuit 101 in FIG. 2 is the writing object. According to this, the potential difference of 5 volts is given between VGG and VDR, so that hot electrons by comparably large channel currents are injected into the floating gate of the nonvolatile memory transistor 113, and thereby the nonvolatile memory transistor 113 is brought into the writing state, here the state of the high threshold voltage. The nonvolatile memory transistor 112 on the opposite side is brought into the erasing state, here the state of the low threshold voltage. As represented by FIG. 2, the mark ○ appended to the floating gate typically designates the injected electrons. In the reading state, the voltage VDD of the wiring 120 is made to gradually increase from 0 volt to 1.8 volts, and the static latch operation corresponding to the difference of the threshold voltages between the nonvolatile memory transistors 112, 113 drives the voltages VDL, VDR of the data lines 118, 119 to the complementary levels. The designation "open" shown in FIG. 3 signifies the floating state of the complementary data lines, depending on the OFF state of the write-in switch transistors 122, 123.

Figure 4:
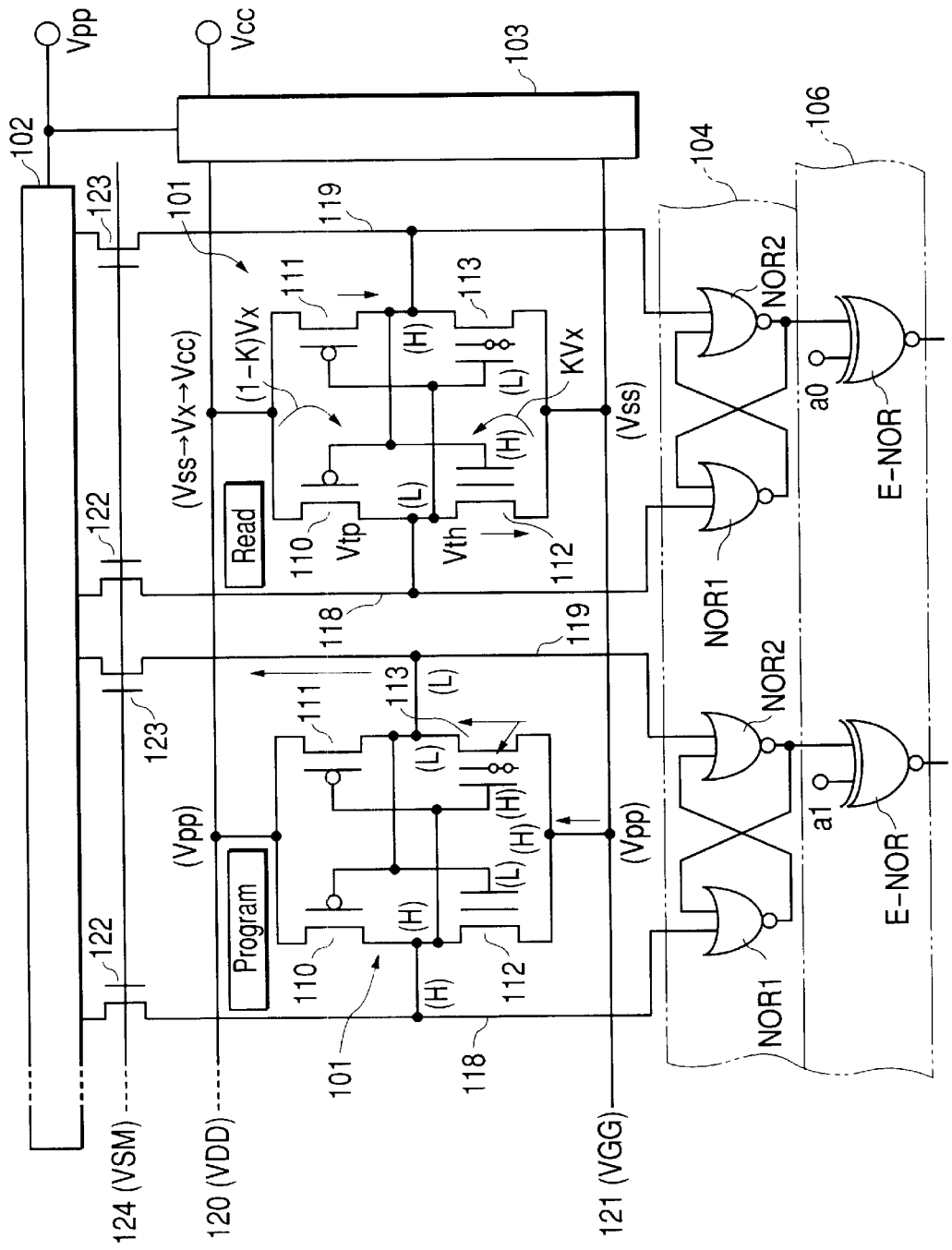
FIG. 4 is a circuit diagram illustrating a further detailed example of the nonvolatile memory in FIG. 1.

FIG. 4 illustrates a further more detailed example of the nonvolatile memory as shown in FIG. 1. The drawing gives a typical example that adopts two nonvolatile memory circuits 101, but omits illustration of the error-correcting code circuit 105, and in place of it, schematically illustrates an address comparison circuit 106.

The data latch circuit 104 is configured with two two-input NOR gates NOR1, NOR2 in a static latch such that the output of one gate NOR1 is fed back to one input of the other gate NOR2, and the output of the other gate NOR2 is fed back to one input of the one gate NOR1. The address comparison circuit 106 is configured with exclusive NOR gates E-NOR that compare the outputs of the data latch circuit 104 with the corresponding bits a0, a1, . . . of the address signals.

The nonvolatile memory circuit 101 designated "Read" in FIG. 4 is typically illustrated as being in the reading state, and the nonvolatile memory circuit 101 designated "Program" is typically illustrated as being in the writing state; however, in the actual memory operation, the reading and the writing are not executed in parallel. In the drawing, Vpp, Vcc, and Vss represent the voltages close to 5 volts, 1.8 volts, and 0 volt, respectively.

In the reading operation Read, when the level VDD of the wiring 120 varies from the voltage Vss to the voltage Vcc, the following condition, for example, needs to be met in order for the nonvolatile memory circuit 101 to perform an accurate self-latch operation in accordance with the threshold voltage state of the nonvolatile memory transistor. That is, the condition is to raise the level VDD of the wiring 120 gradually from the voltage Vss to the low threshold voltage, so that the nonvolatile memory transistor having the initial threshold voltage (Vtni) is brought to the ON state first. Now, provided that the coupling ratio determined by the overlapping capacitance of the p-channel MIS transistor and the n-channel MIS transistor, in other words the ratio of the channel area of the n-channel MIS transistor relative to the channel area of the p-channel MIS transistor, is given by K, and the coupling ratio of the control gates is given by η, the following relation is met:

$Vtni/K < Vtp/(1-K)$, here $Vtni = Vtn/\eta$, and $Vtn < Vtp \cdot \eta K/(1-K)$ is deduced.

Accordingly, to satisfy the relation: $Vtn(max) < Vtp(min) \cdot \eta K/(1-K)$, the operational condition is only needed to set the sizes of the load MIS transistors 110, 111.

In the reading operation, as long as power from the power supply is provided, the data latch circuit 104 holds the information read from the nonvolatile memory circuit 101. In this state, it is not necessary to make the nonvolatile memory circuit 101 maintain the static latch operation. Thereafter, the operational supply Vcc for the static latch operation by the nonvolatile memory circuit 101 may be suspended. Preferably, the readout control circuit 103 contains a power-off function. For example, the readout control circuit 103 supplies the operational supply Vcc for the static latch operation to the nonvolatile memory circuit 101 in response to the read instruction, and stops the supply of the operational supply Vcc after the data latch circuit 104 completes the latch operation in response to the static latch operation.

The foregoing configuration makes it possible to avoid a useless application of voltage to the nonvolatile memory transistors, which shortens the period during which the nonvolatile memory transistors are exposed uselessly to the voltages that create the charge gain and the charge loss, thereby enhancing the information holding performance over the long term.

Here, the nonvolatile memory circuit 101 is employed for the storage of redundant address data to relieve defective circuits. It is advisable to supply the read instruction in response to the reset instruction to the semiconductor device, when there presumably exists information that has to already be reflected to the functions of the internal circuits, in a state that the semiconductor device is operable, as with redundant address data.

Figure 5:
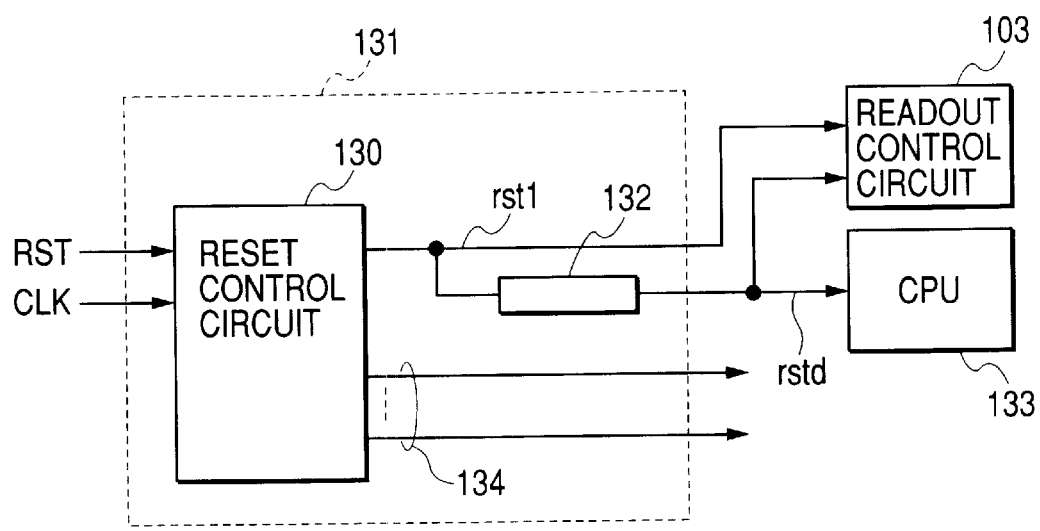
FIG. 5 is a block diagram illustrating one example in which the automatic power off function is achieved in performing a reading operation by a readout control circuit in response to a reset instruction.

FIG. 5 illustrates one example that achieves the automatic power off function in executing the reading operation by the readout control circuit 103 in response to the reset instruction. Presuming a microcomputer as the semiconductor device, FIG. 5 shows a case in which a CPU operating as the data control device is incorporated, and in which a reset signal RST is supplied from outside in the case of a manual reset and power on reset. In FIG. 5, a reset control circuit 130 is included in a system controller 131. The reset control circuit 130 receives the reset signal RST and a system clock signal CLK. When the reset signal RST is maintained at the high level for a certain period of time and, thereafter, is reversed to the low level, an initialization signal rstl is pulse-modulated. The initialization signal rstl is delayed for a certain time by a delay circuit 132, thereby producing a delay initialization signal rstd. The initialization signal rstl is supplied to the readout control circuit 103, which gradually supplies the operating voltage to the wiring 120 in response to the pulsed modulation to finally reach the voltage Vcc. The delay time by the delay circuit 132 is set to correspond to the time from the start of supply the operating voltage to the nonvolatile memory circuit 101 at least until the completion of the self-latch operation. As the delay initialization signal rstd is pulse-modulated after that delay time, the readout control circuit 103 halts the supply of the voltage Vcc to the wiring 120. The pulsed modulation of the delay initialization signal rstd is also given to a CPU 133, and thereby the CPU 133 initializes the program counter to a zero address, and starts to execute the instructions from the zero address. The other initialization signals indicated generally by the numeric symbol 134 are the control signals that initialize the defined signal input nodes and output nodes inside the semiconductor device into defined logic values.

In case of FIG. 5, after the relief address data are read out to the data latch circuit 104 to make the relief to a to-be-relieved circuit possible, the CPU 133 is put into the command executable state; therefore, a specified relief for the defective parts is already completed, when the CPU 133 starts executing the command, and the occurrence of malfunctions resulting from defective parts can be deterred in advance.

Figure 6:
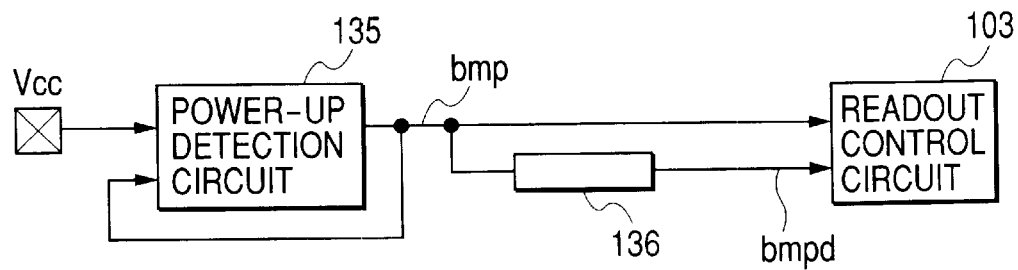
FIG. 6 is a block diagram illustrating one example in which the automatic power off function is realized in a semiconductor device not having a reset terminal.

FIG. 6 illustrates one example that achieves the automatic power off function in a semiconductor device not having a reset terminal. This case utilizes a voltage detection signal bmp by a power-boost detection circuit 135 to detect the state in which the voltage Vcc supplied to the semiconductor device from outside is stabilized to a stipulated voltage. The power-boost detection circuit 135, though not especially stipulated, has a clamp circuit that is brought into the non-clamping state in response to the initial state of a capacitance circuit connected to the input of the clamp circuit to output the operating supply voltage. The clamp circuit has a cnarge transistor anct a discharge transistor connected to the input thereof. The discharge transistor is put into the OFF state in response to the output of the clamp circuit that is brought into the non-clamping state at the beginning of power supply from the outside. In proportion to the increase of the operating supply voltage, the charge transistor gradually charges the input of the clamp circuit. When the input of the clamp circuit exceeds the logic threshold voltage, the clamp circuit is inverted into the clamping state. In response to this, the output signal bmp of the power-boost detection circuit 135 varies from the operating supply voltage to the ground voltage of the circuit. The output signal bmp is passed through a delay circuit 136 so as to be transformed into a delayed pulse signal bmpd. In response to the pulsed modulation of the signal bmp, the readout control circuit 103 gradually supplies the operating voltage to the wiring 120 to finally reach the voltage Vcc. The delay time by the delay circuit 136 is set to correspond to the time from the start of supplying the operating voltage to the nonvolatile memory circuit 101 at least until the completion of the self-latch operation. As the delay initialization signal bmpd is pulse-modulated after that delay time, the readout control circuit 103 halts the supply of the voltage Vcc to the wiring 120.

Figure 7:
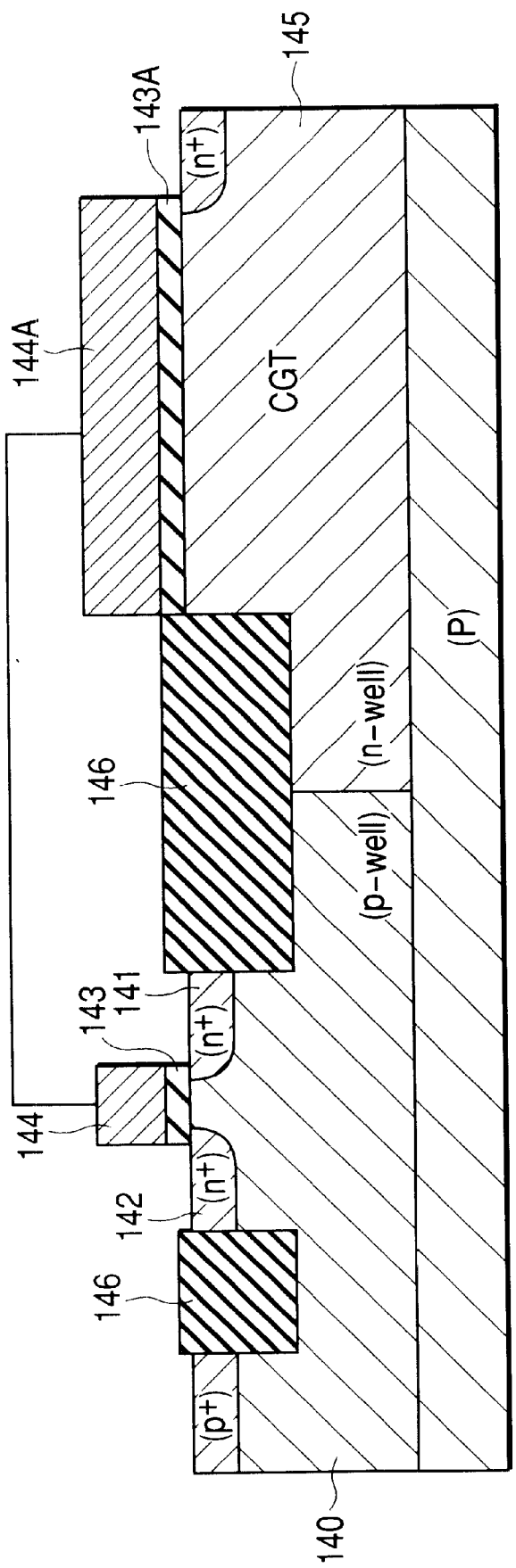
FIG. 7 is a vertical sectional view schematically illustrating a sectional structure of the nonvolatile memory transistor.

FIG. 7 schematically illustrates a sectional structure of the nonvolatile memory transistor 112. The nonvolatile memory transistor 112 includes a MIS transistor having a source 141 and a drain 142 of the second conductive type (n-type) that is formed in a semiconductor region (p-well) 140 of the first conductive type (p-type), a gate insulating film 143 formed on the channel between the source 141 and the drain 142, and a floating gate 144 formed on the gate insulating film 143, and a control gate (CGT) formed in a semiconductor region (n-well) 145 of the second conductive type, underlying a gate insulating film 143A formed beneath an extended portion 144A of the floating gate 144. The numeric symbol 146 denotes a device separation region. Thus, the nonvolatile memory transistor has a MIS transistor and a control gate underlying a floating gate of the MIS transistor with an insulating gate between; and it can be produced by means of the manufacturing processes of the single p olysilicon process and the like. The control gate is formed with an impurity-introduced layer.

Figure 8:
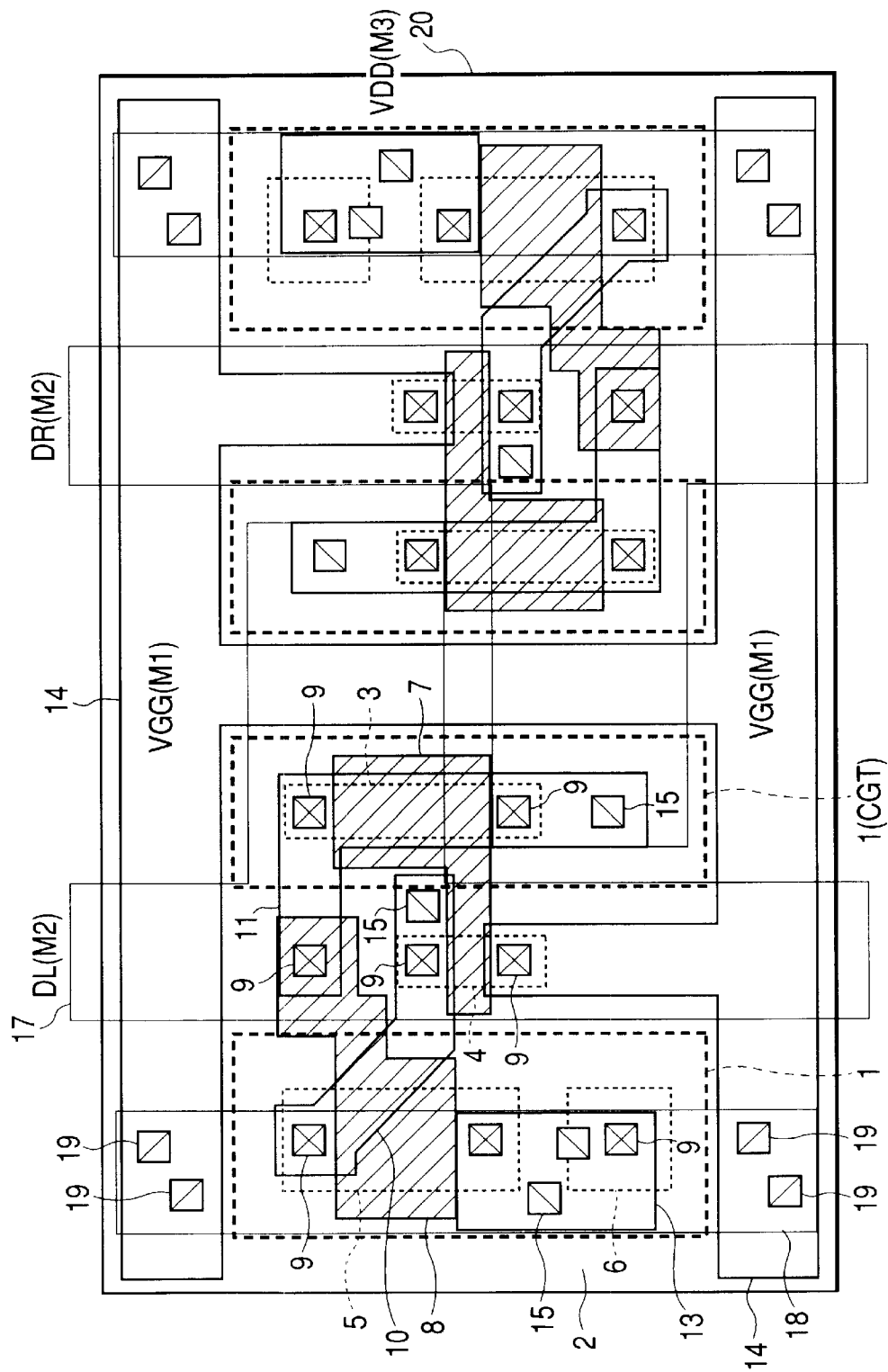
FIG. 8 is a plan view illustrating a detailed plane layout of the nonvolatile memory circuit.

FIG. 8 illustrates a detailed plane layout of the nonvolatile memory circuit 101. The layout has the three-layer structure of a first metal wiring layer M1, a second metal wiring layer M2, and a third metal wiring layer M3, in which contact holes indicated by the numeric symbol 9 connect the semiconductor substrate or the well regions with the first metal wiring layer M1, through holes indicated by the numeric symbol 15 connect the wiring layer M1 and the wiring layer M2, and through holes indicated by the numeric symbol 19 connect the wiring layer M2 and the wiring layer M3. The wiring for VDD formed with the wiring layer M3 forms a solid wiring pattern indicated by the numeric symbol 20. The lines DL and DR correspond to the complementary data lines 118 and 119.

The control gate of the nonvolatile memory transistor is formed with the second conductive type semiconductor region 1 (CGT) provided in the first conductive type semiconductor region 2. The floating gate is formed with a conductive layer (polysilicon layer) 7 disposed on the upper part of the control gate by way of the gate insulating film by passing over the channel of the MIS transistor that is formed in an active region 4 of the first conductive type semiconductor region 2. The control gate is formed with the second conductive type semiconductor region 1 (CGT) disposed under an active region 3 overlapping with the floating gate by way of the gate insulating film. The numeric symbols 11, 13 represent the patterns of the first metal wiring layer M1, 17 denotes the pattern of the second metal wiring layer M2, and 20 denotes the pattern of the third metal wiring layer M3. The channel area of the load MIS transistor formed in an active region 5 and the channel area of the MIS transistor of the nonvolatile memory transistor formed in the active region 4 are formed so as to satisfy the relation required for the aforementioned self-latch operation.

Second Example of Flip-Flop Type Nonvolatile Memory Circuit

Figure 9:
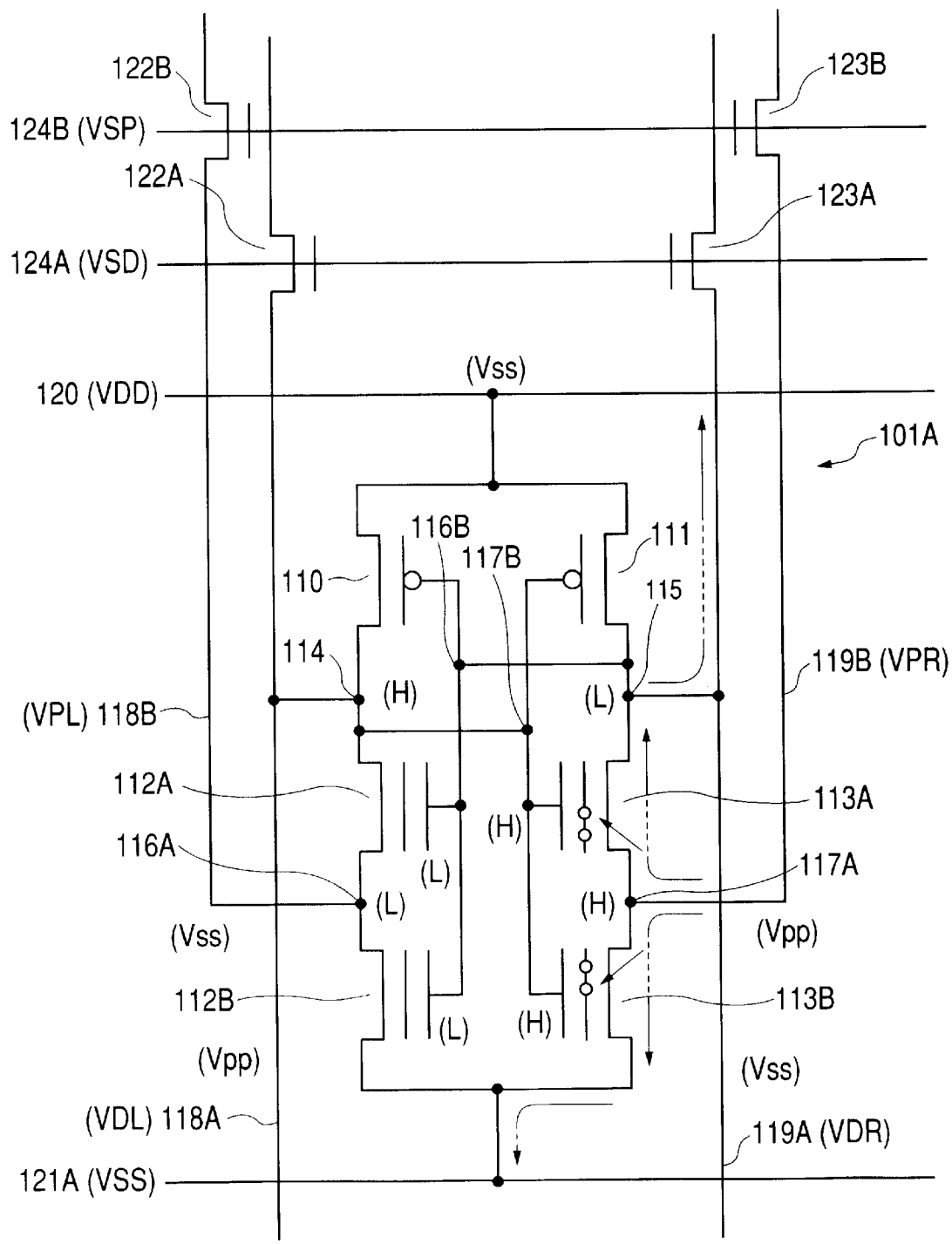
FIG. 9 is a circuit diagram illustrating another example of the nonvolatile memory circuit.

FIG. 9 illustrates another example of the nonvolatile memory circuit. When the thickness of the gate insulating film of the foregoing nonvolatile memory transistor is made equal to that of the MIS transistor of an external interface circuit, and yet a sufficient information holding performance cannot be achieved in terms of the gate insulating film thickness, the adoption of a flip-flop configured with a plurality of nonvolatile memory transistors connected in series, as shown in FIG. 9, makes it possible to still further enhance the information holding performance.

FIG. 9 illustrates a nonvolatile memory circuit 101A that has, as the loads, a pair of series circuits with two nonvolatile memory transistors connected in series. The load transistors are the first conductive (for example, p-channel) MIS transistors 110, 111 with the source, drain, and gate in the same manner as the foregoing; and the nonvolatile memory transistors are the second conductive (n-channel) type transistors 112A, 112B, 113A, 113B with the source, drain, floating gate, and control gate. The load MIS transistors 110, 111 are coupled to the nonvolatile memory transistors 112A, 113A, and the coupling points are referred to as the output nodes 114, 115. Further, the nonvolatile memory transistors 112A, 113A each have the nonvolatile memory transistors 112B, 113B connected in series, and the coupling points are referred to as the program nodes 116A, 117A. The gate of the load MIS transistor 110 (111) is commonly coupled with the control gates of the nonvolatile memory transistors 112A, 112B (113A, 113B), and the coupling points are referred to as the control nodes 116B (117B). The pair of the series circuits forms a static latch configuration with the output node 114 (115) of the one series circuit connected to the control gate 117B (116B) of the other series circuit. The load MIS transistors 110, 111 have the sources connected to a wiring 120, and the nonvolatile memory transistors 112B, 113B have the sources connected to a wiring 121A. The output nodes 114, 115 in both the series circuits are each connected to complementary data lines 118A, 119A, and the program nodes 116A, 117A in both the series circuits are each connected to complementary program control lines 118B, 119B. On the complementary data lines 118A, 119A, n-channel type write-in switch MIS transistors 122A, 123A are controlled and switched by the signal voltage VSD of a wiring 124A; on the complementary program control lines 118B, 119B, n-channel type write-in switch MIS transistors 122B, 123B are controlled and switched by the signal voltage VSP of a wiring 124B. These MIS transistors 122A, 122B, 123A, 123B are turned ON during the write-in operation, and are OFF otherwise.

FIG. 10 illustrates the state of the voltages in writing, erasing, reading, and standby in relation to the nonvolatile memory transistor 101A, which shows a case in which the nonvolatile memory transistors 113A, 113B that are laid out right in the nonvolatile memory circuit 101A in FIG. 9 are the writing objects. According to this, the potential difference of 5 volts is given between VSS, VDR and VPR, so that hot electrons by comparably large channel currents are injected into the floating gates of the nonvolatile memory transistors 113A, 113B, and thereby the nonvolatile memory transistors 113A, 113B are brought into the writing state, here the state of the high threshold voltage. The nonvolatile memory transistors 112A, 112B on the opposite side are brought into the erasing state, here the state of the low threshold voltage. In the reading state, in the same manner as the above, the voltage VDD of the wiring 120 is made to gradually increase from 0 volt to 1.8 volts, and the static latch operation corresponding to the difference of the threshold voltages between the nonvolatile memory transistors 112A, 112B and 113A, 113B drives the voltages VDL, VDR of the data lines 118A, 119A to the complementary levels. The designation "open" shown in FIG. 10 signifies the floating state of the complementary data lines 118A, 119A, depending on the OFF state of the write-in Vitch transistors 122A, 122B, 123A, 123B.

Figure 11:
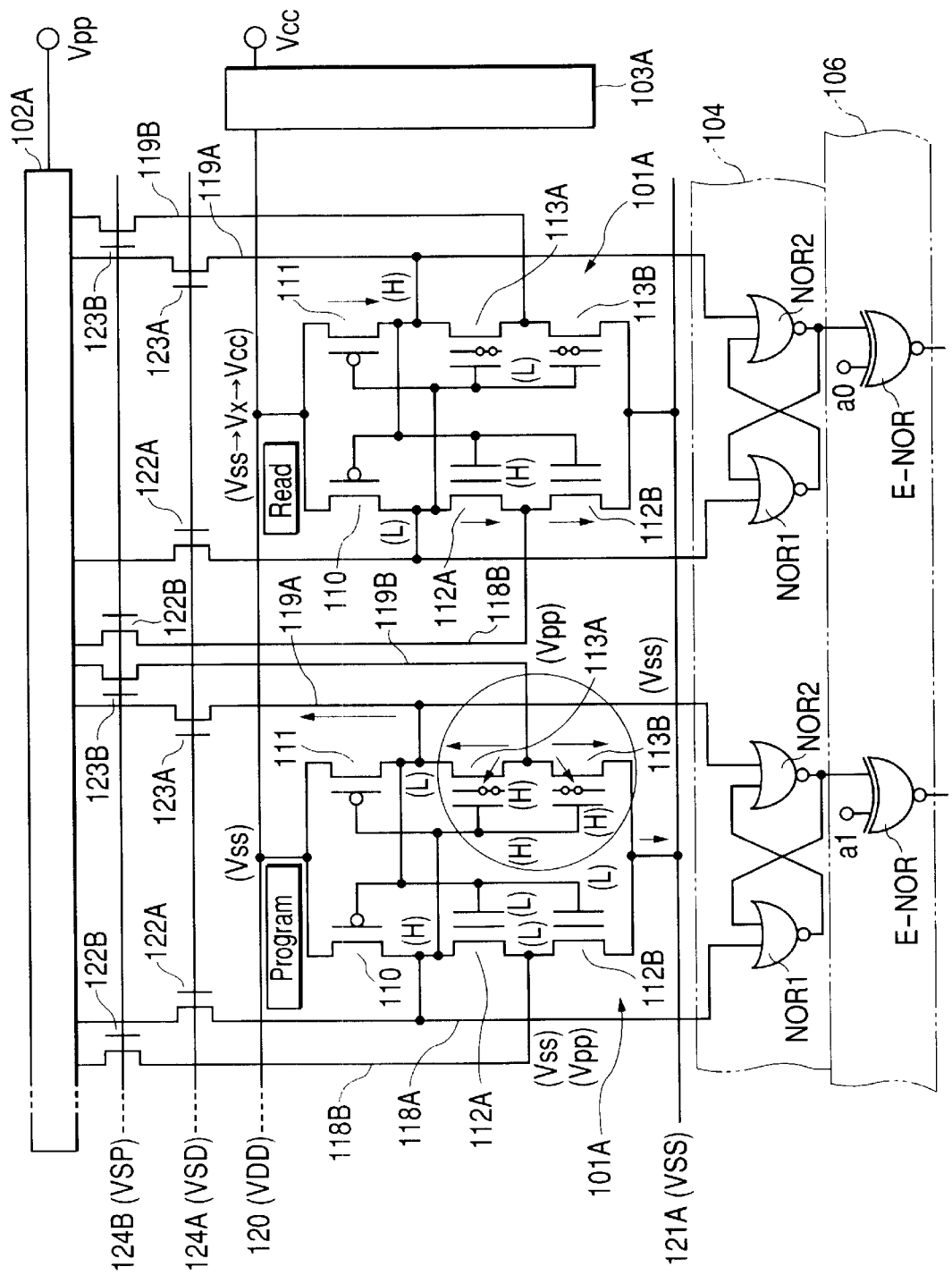
FIG. 11 is a circuit diagram illustrating a detailed example of the nonvolatile memory adopting the nonvolatile memory circuit illustrated in FIG. 9.

FIG. 11 illustrates a detailed example of the nonvolatile memory that adopts the nonvolatile memory circuit 101A in FIG. 9. The drawing gives as a typical example two nonvolatile memory circuits 101A, but omits illustration of the error-correcting code circuit 105, and in place of it, schematically illustrates the address comparison circuit 106. The symbol 102A denotes the write-in control circuit, and 103A denotes the readout control circuit, whose basic functions are the same as in FIG. 1 and FIG. 4.

The nonvolatile memory circuit 101A designated "Read" in FIG. 11 is typically illustrated as being in the reading state, and the nonvolatile memory circuit 101A designated "Program" is typically illustrated as being in the writing state; however, in the actual memory operation, the reading and the writing are not executed in parallel. In the drawing, Vpp, Vcc, and Vss represent the voltages Close to 5 volts, 1.8 volts, and 0 volt, respectively.

In the reading operation Read, when the level VDD of the wiring 120 varies from the voltage Vss to the voltage Vcc, the same condition described with reference to FIG. 4 is satisfied, in order that the nonvolatile memory circuit performs an accurate self-latch operation in accordance with the threshold voltage state of the nonvolatile memory transistor.

In the reading operation, as long as power from the power supply is provided, the data latch circuit 104 holds the information read from the nonvolatile memory circuit 101A. En this state, it is not necessary to make the nonvolatile memory circuit 101A maintain the static latch operation. Thereafter, the operational supply Vcc for the static latch operation by the nonvolatile memory circuit 101A may be suspended. Preferably, the readout control circuit 103A contains the power-off function. For example, the readout control circuit 103A supplies the operational supply Vcc for the static latch operation to the nonvolatile memory circuit 101A in response to the instruction of the reading operation, and stops the supply of the operational supply Vcc after the data latch circuit 104 completes the latch operation in response to the static latch operation.

The foregoing configuration makes it possible to avoid a useless application of voltage to the nonvolatile memory transistors, which shortens the period during which the nonvolatile memory transistors are exposed uselessly to the voltages that create the charge gain and the charge loss, thereby enhancing the information holding performance over a long term.

Here, the nonvolatile memory circuit 101A is employed for the storage of redundant address data to relieve defective circuits. It is preferable to issue the read instruction in response to the reset instruction to the semiconductor device, in a state in which the semiconductor device is operable as with the redundant address data, when there presumably exists information that has to already be reflected to the functions of the internal circuits. The automatic power-off function in performing the reading operation by the readout control circuit 103A in response to the reset instruction can be implemented with the same configuration as in FIG. 5, FIG. 6.

Now, the readout defect rate in the flip-flop circuit configured with the two-series nonvolatile memory transistors as shown in FIG. 9 will be considered. If the defect rate after 10 years in the circuit that configures the flip-flop with one nonvolatile memory transistor as shown in FIG. 2 is given by f, Case 1: the probability Pa that both the two cells are non-defective:

$$Pa=(1-f)^2 \quad (1)$$

Case 2: the probability Pb that either one of the cells is defective:

$$Pb=(1-f)\cdot f+f\cdot(1-f)=2f\cdot(1-f) \quad (2)$$

Case 3: the probability Pc that both of the two cells are defective:

$$PC=f^2 \quad (3)$$

Here, Pa+Pb+Pc=$(1-f)^2+2f\cdot(1-f)+f^2=1$. Provided that the total bit number of the nonvolatile memory modules is given by N, the non-defective condition signifies that there does not exist even one bit of the Case 3; here, the N-bits are in the state of either the Case 1 or the Case 2. Therefore, the non-defective probability Y is expressed as follows.

$$Y=\Sigma_N C_K Pa^K Pb^{N-K} \quad (4)$$

The defect rate F of the nonvolatile memory modules is:

$$F=1-Y=1-\Sigma_N C_K Pa^K Pb^{N-K} \quad (5)$$

According to the binominal theorem, $$Y = \Sigma_N C_K Pa^K Pb^{N-K} = (Pa+Pb)^N \quad (6)$$
$$= \{(1-f)^2 + 2f\cdot(1-f)\}^N$$
$$= (1-f^2)^N$$
$$\therefore F = 1-(1-f^2)^N$$

Incidentally, the non-defective probability Y' in the flip-flop circuit configured with one nonvolatile memory transistor can be expressed as follows, since, if only one bit of the N bits is defective, it is counted as a chip defect.

$$Y'=(1-f)^N \quad (7)$$

Therefore, the defect rate F' of the nonvolatile memory modules in the flip-flop circuit configured with one nonvolatile memory transistor can be expressed as follows.

$$F'=1-(1-f)^N \quad (8)$$

Therefore, the improvement rate R to the defect rate of the modules in case of adopting the nonvolatile memory circuit 101A in FIG. 9 is given by:

$$R=F/F'{\sim}f \quad (9)$$

In case of f=0.01%, the defect rate is reduced to 1/10,000, which shows a remarkable improvement of the defective occurrence rate.

Figure 12:
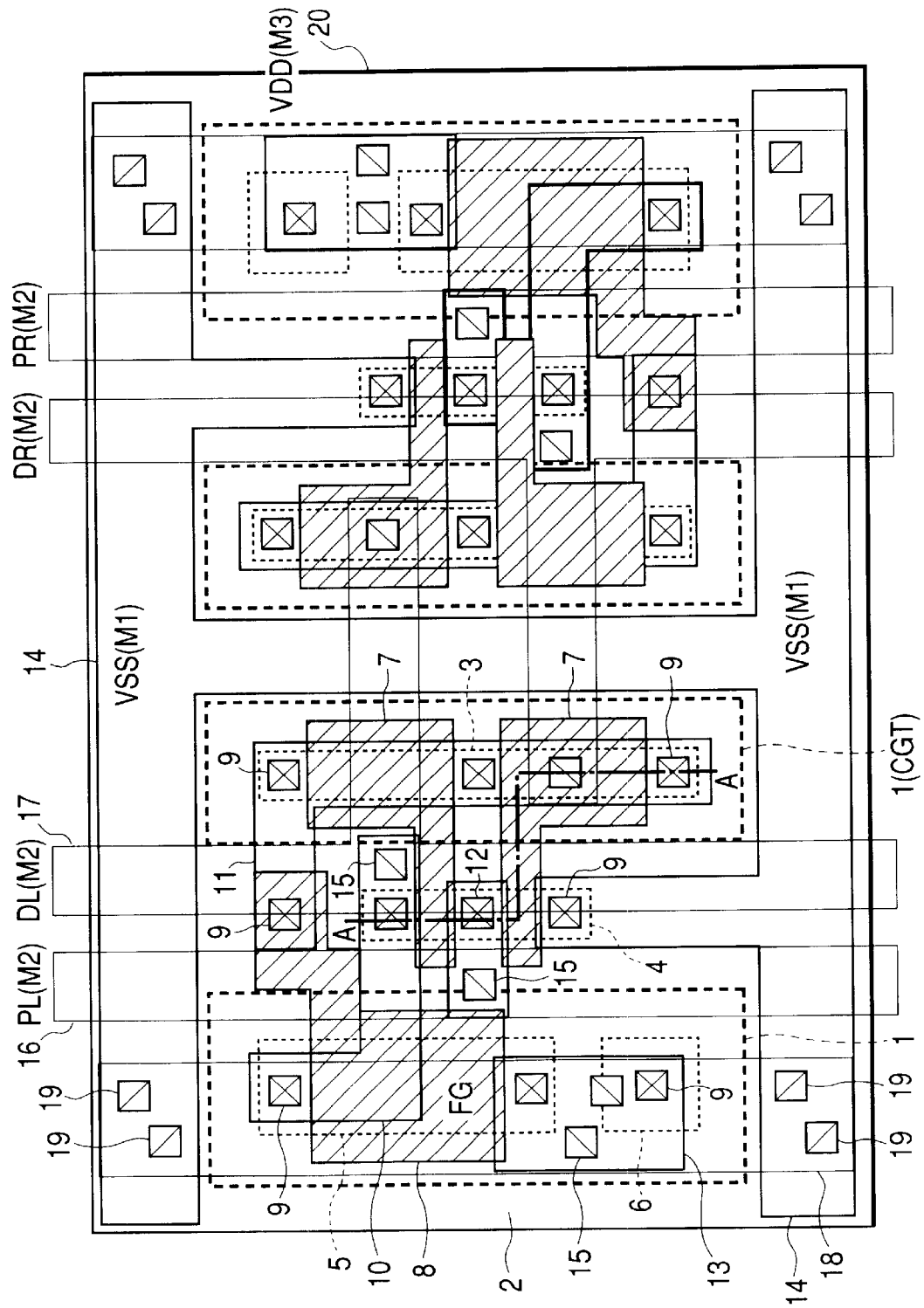
FIG. 12 is a plan view illustrating a detailed plane layout of the nonvolatile memory circuit illustrated in FIG. 9.

FIG. 12 illustrates a detailed plane layout of the nonvolatile memory circuit 101A. The layout has, in the same manner as in FIG. 8, a three-layer structure of the metal wiring layers M1, M2, M3, where the contact holes 9 and the through holes 15, 19 have the same functions and structures as in FIG. 8. The wiring for VDD formea with the wiring layer M3 forms the solid wiring pattern indicated by the numeric symbol 20. The lines DL and DR correspond to the complementary data lines 118A and 119A; and the lines PL and PR correspond to the complementary control lines 118B and 119B.

The control gate of the nonvolatile memory transistor is formed with the n-type well region 1 (CGT) located near the center. The floating gate is formed with the conductive layer 7 extended to the control gate by way of the gate insulating film by passing over the channel of the MIS transistor that is formed in the active region 4 of the p-type well region 2. The conductive layer 7 is, for example, a polysilicon layer. The control gate is formed with the n-type semiconductor region 1 disposed under the active region 3 extended beneath the floating gate by way of the gate insulating film. The numeric symbol 9 represents the contact hole pattern, 11, 13, 14 denote the patterns of the first metal wiring layer M1, 17 denote the pattern of the second metal wiring layer M2, and 20 denote the pattern of the third metal wiring layer M3.

Figure 13:
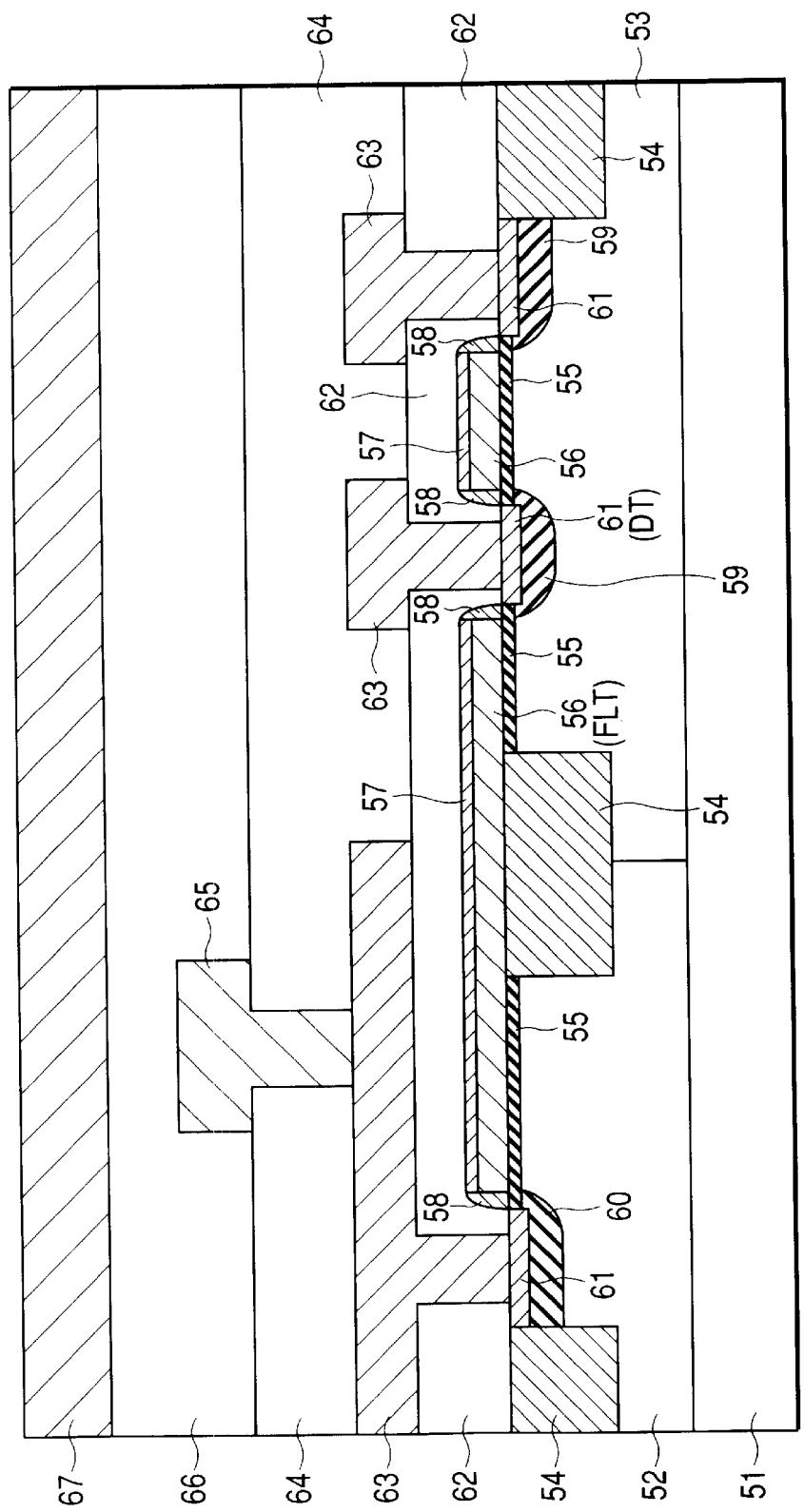
FIG. 13 is a vertical sectional view illustrating a vertical sectional structure at the position A–A' in FIG. 12.

FIG. 13 illustrates a vertical sectional structure at the position A–A' in FIG. 12. On a p-type semiconductor substrate 51, an n-type well region 52 and a p!type well region 53 are formed. Inside the n-type well region 52 that functions as the control gate, a p-type diffusion layer 60 separated by a device separation region 54 and a gate oxide film 55 of a thickness 7.5 nm are formed. The floating gate (FLT) made of an n-type polysilicon film 56 overlies the date oxide film 55. The floating gate 56 (FLT) overlies the p-type well region 53 as well, and functions as the gate electrode of a first MIS transistor, which is one of the constituent elements of the nonvolatile memory transistor. An n-type drain region 59 (DT) of the first MIS transistor is commonly used as an n-type drain region of a second MIS transistor, and the first and second MIS transistors are connected in series. Cobalt silicide films 61, 57 are formed to overlie the p-type diffusion layer 60, the floating gate 56 (FLT), and the n-type Zir-ain region 59; and, over the silicide films, a contact insulating film 62, a first metal wiring 63, a first interlayer insulating film 64, a second metal wiring 65, a second interlayer insulating film 66, and a third metal wiring 67 are formed. The numeric symbol 58 represents the sidewall spacer.

Figure 14:
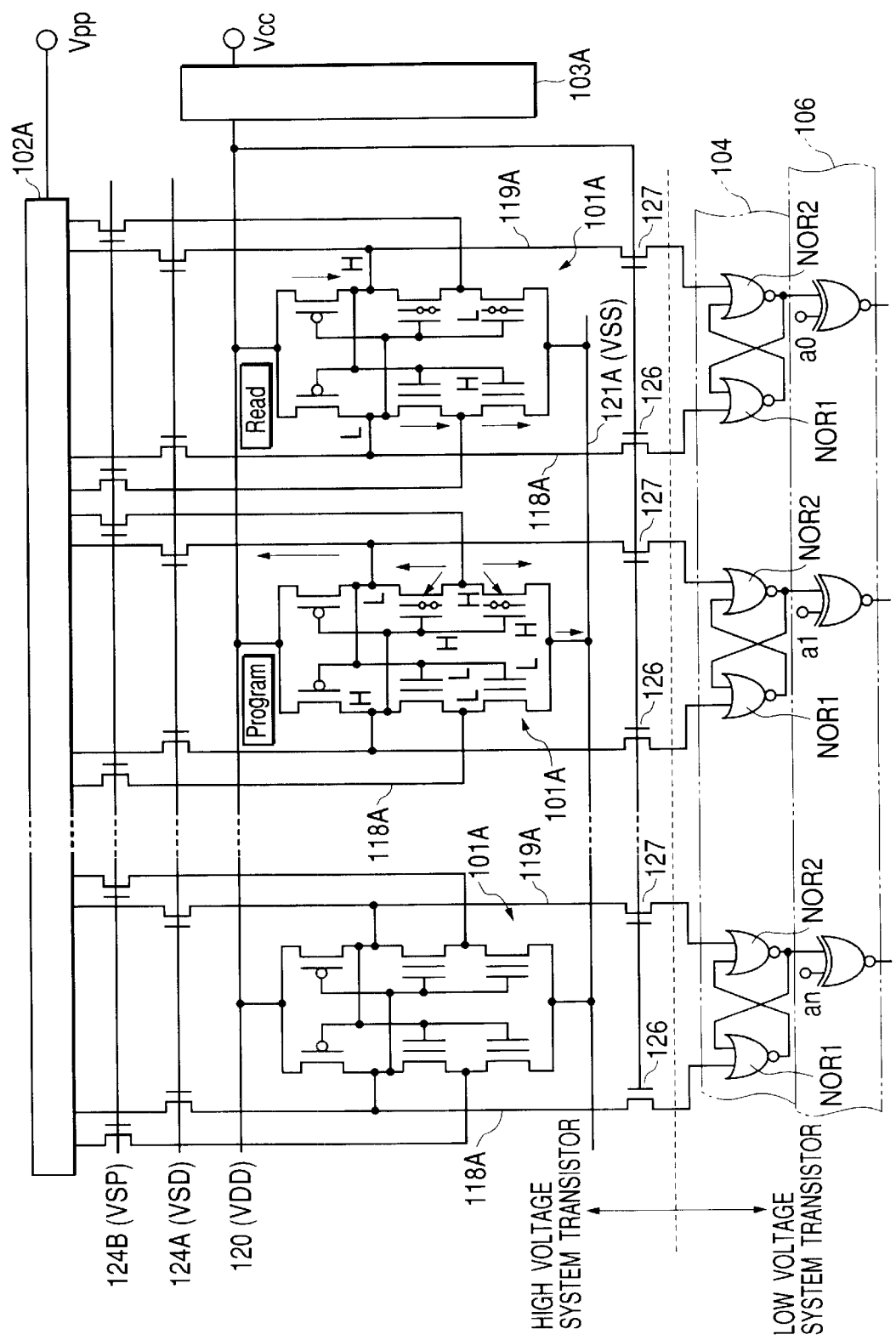
FIG. 14 is a circuit diagram illustrating one example of a self-latch type nonvolatile memory having two types of gate oxide films.

FIG. 14 illustrates one example of a self-latch type nonvolatile memory having two types of gate oxide films. The basic configuration of the nonvolatile memory circuit 101A and so forth shown in FIG. 14 is the same as described with reference to FIG. 1. It is assumed that the nonvolatile memory circuit 101A, the write-in control circuit 102A, and the readout control circuit 103A having the automatic power-off function are composed of the high voltage system transistor with the gate oxide film thickness of 7.5 nm that operates with the voltage of 3.3 volts, and the data latch circuit 104 is composed of the low voltage system transistor with the gate oxide film thickness of 3.5 nm that operates with the voltage of 1.8 volts. In this case, the voltage for writing and erasing is not the high voltage Vpp, 5 volts, but is 3.3 volts, which is different from the aforementioned embodiment. Here, the complementary data lines 118A, 118B are connected to the data latch circuit 104 by way of separating switches 126, 127 made of the n-channel MIS transistors. The separating switches 126, 127, being switched and controlled by the signal voltage VDD of the wiring 120 and turned ON in the reading operation, transmit data read out from the nonvolatile memory circuit 101A to the data latch circuit 104. In the writing operation and erasing operation to the nonvolatile memory circuit 101A, the separating switches 126, 127 are turned OFF, and thereby a high write-in voltage that exceeds the withstand voltage, such as 3.3 volts, is not applied to the low voltage system transistors constituting the data latch circuit 104, thus preventing a gate breakdown and the like.

Figure 15:
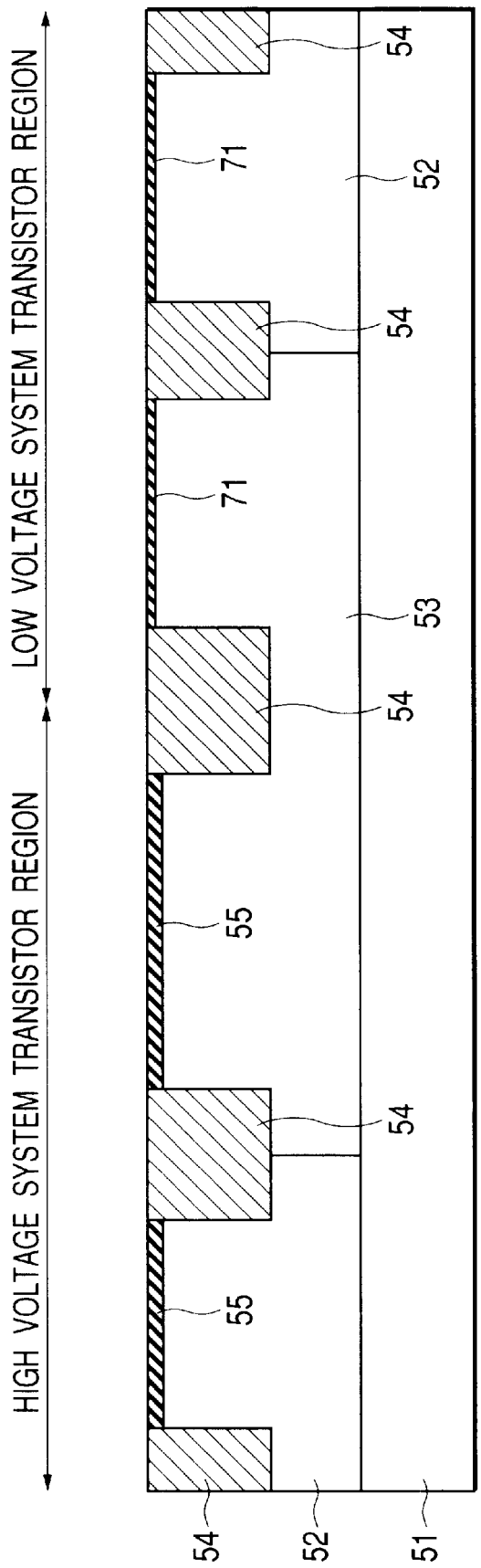
FIG. 15 is a vertical sectional view illustrating a state in which a semiconductor device having high voltage system transistors and low voltage system transistors has completed the intermediate processing step.
Figure 16:
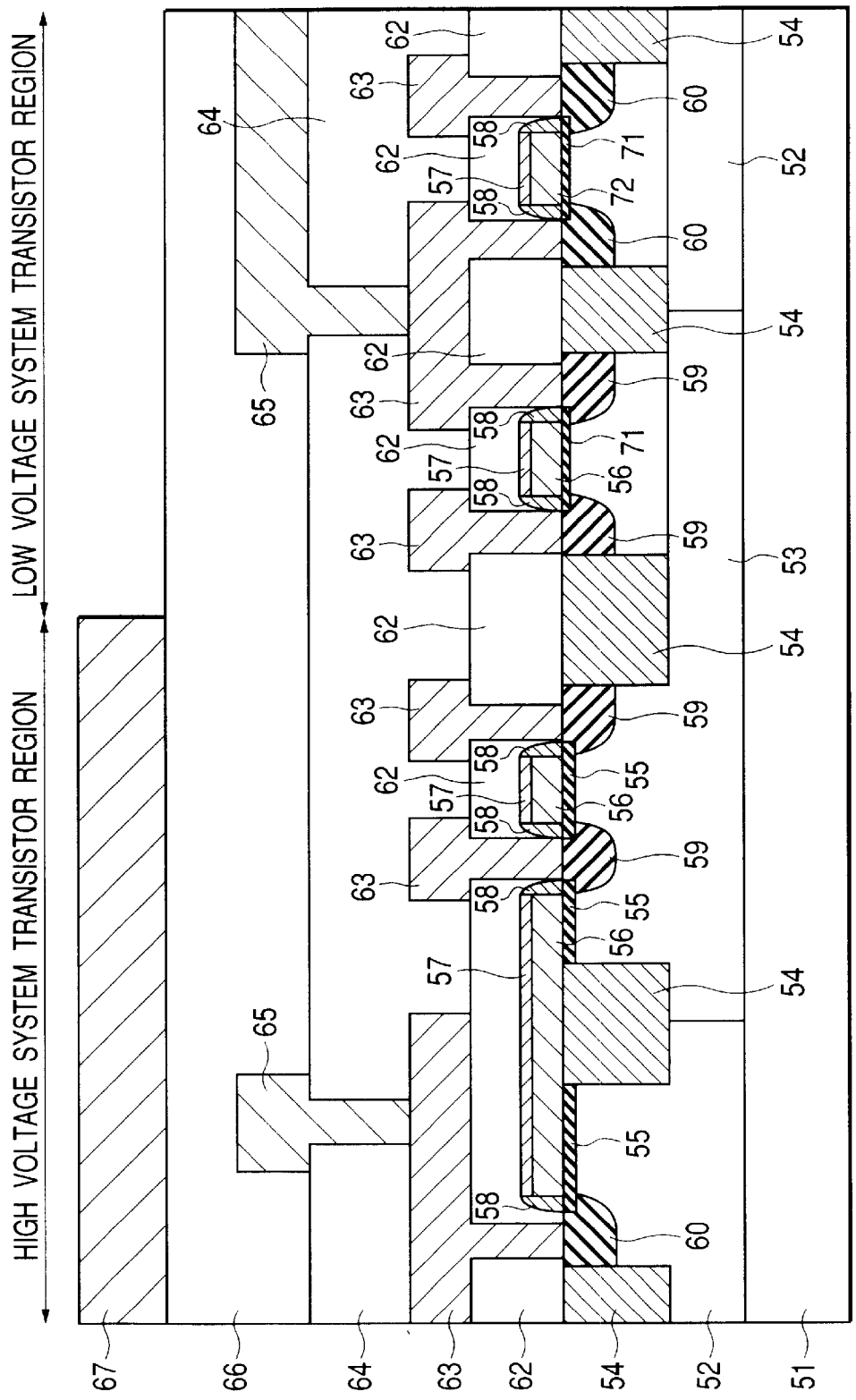
FIG. 16 is a vertical sectional view illustrating a state in which the semiconductor device having high voltage system transistors and low voltage system transistors has completed the whole step after the intermediate processing step shown in FIG. 15.

FIG. 15 and FIG. 16 illustrate vertical sectional structures of the high voltage system transistor with the gate oxide film thickness of 7.5 nm that operates with the voltage 3.3 volts, and the low voltage system transistor with the gate oxide film thickness of 3.5 nm that operates with the voltage 1.8 volts. FIG. 15 illustrates the sectional structure after completing the intermediate process that has formed the gate insulating film in the p-type well region and the n-type well region on the semiconductor substrate. A gate insulating film 55 in the high voltage system transistor region is formed to be thicker than a gate insulating film 71 in the low voltage system transistor region. The reference symbols in FIG. 15 and FIG. 16 correspond to those in FIG. 13.

Relief Fuse in System LSI

Figure 17:
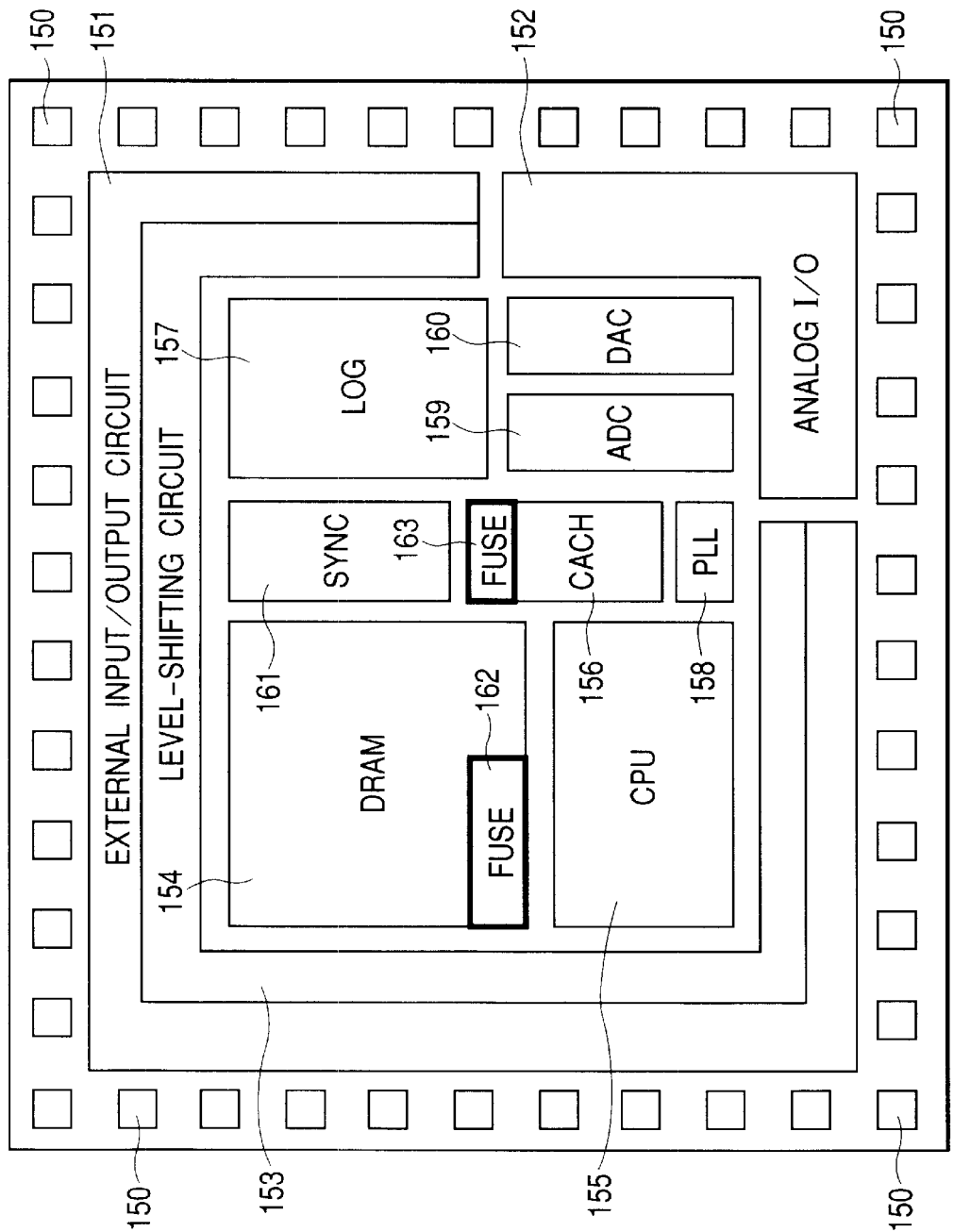
FIG. 17 is a plan view of a system LSI chip illustrating one example of the semiconductor device relating to the invention.

FIG. 17 schematically illustrates a system LSI chip as one example of the semiconductor device relating to the invention. The system LSI has, though not especially stipulated, external connection electrodes 150 of multiple bonding pads and so forth disposed on the periphery of the semiconductor substrate, and an external input/output circuit 151 and an analog input/output circuit 152 installed inside the electrodes. The external input/output circuit 151 and the analog input/output circuit 152 operate with a relatively high supply voltage such as 3.3 volts, from the outside. A level-shifting circuit 153 steps down the external supply voltage to an internal supply voltage, such as 1.8 volts. The system LSI further includes, inside the level-shifting circuit 153, a dynamic random access memory (DRAM) 154, a central processing unit (CPU) 155, a cache memory (CACH) 156, a logic circuit (LOG) 157, a phase locked loop circuit (PLL) 158, an analog digital converter (ADC) 159, a digital analog converter (DAC) 160, and a system controller (SYSC) 161. The numeric symbols 162, 163 signify the nonvolatile memory (FUSE) that is capable of electrically erasing and writing, which contain the nonvolatile memory circuits described with reference to FIG. 2 and FIG. 9 as the memory cells. The system controller 161 has the logic that generates the initialization signals rstl, rstd, and so forth for implementing the automatic power-off function described with reference to FIG. 5, and supplies these signals to the readout control circuits of the nonvolatile memories 162, 163.

The DRAM 154, CPU 155, CACH 156, LOG 157, SYSC 161 operate with the internal supply voltage, such as 1.8 volts, supplied by the level-shifting circuit 153. However, the DRAM 154 steps up the internal supply voltage to make a word selection level, which is used as the operating voltage for the word drivers and the like.

The nonvolatile memory (FUSE) 162 is used for storing the relief information (control information to replace defective memory cells by redundant memory cells) of the DRAM 154. The nonvolatile memory (FUSE) 163 is used for storing the relief information of the cache memory 156, and is installed in replacement of a relief program circuit by a fuse.

The system LSI illustrated in FIG. 17 has a complementary MIS transistor (insulating gate field effect transistor) formed on one semiconductor substrate such as a single crystal silicon by means of the single layer polysilicon gate process, which is not especially stipulated; and there are two types of gate oxide film thickness of the MIS transistor.

The external input/output circuit 151, analog input/output circuit 152, DRAM 154, ADC 159, DAC 160, and nonvolatile memories 162, 163 have the MIS transistor with a gate length of 0.4 μm and a gate oxide film thickness of 8 nm, in case of adopting the 0.2 μm processing technique, which is not especially stipulated. This is because the provision of a comparably large thickness to a tunnel oxide film formed with the gate oxide film is preferable to enhance the information holding performance of the nonvolatile memory transistors 112, 113 (112A, 112B, 113A, 113B), and in addition the guarantee of a certain degree of withstand is essential. Therefore, the gate insulating film of the MIS transistors constituting the nonvolatile memory transistors of the nonvolatile memories 162, 163 and the gate insulating film of the MIS transistors contained in the external interface circuit 151 are to take on an equal film thickness within the allowance due to the process dispersion. The allowance of the gate insulating film thickness due to the process dispersion is about ±0.5 nm against the target film thickness 8.0 nm, in the process for the minimum processing dimension of 0.25 μm to 0.2 μm. or is about ±0.3 nm relative to the target film thickness of 7.0 nm, in the process for the minimum processing dimension of 0.18 μm to 0.15 μm, which is not especially stipulated.

On the other hand, the circuits that operate with a comparably low internal voltage that is stepped down from the external voltage, that is, the logic circuit 157, cache memory 156, and CPU 155, include a MIS transistor with a gate length of 0.2 μm and a gate oxide film thickness of 4 nm. The level-shifting circuit 153 has MIS transistors with both of the gate oxide film thicknesses, which is not especially stipulated.

The gate electrodes of the MIS transistors, each having a different gate oxide film thickness, are formed of a polysilicon layer having an identical film thickness. Here, the identical film thickness of the polysilicon layer signifies an equal film thickness within the allowance due to the process dispersion, and the allowance of the gate film thickness due to the process dispersion is about ±10% against the target film thickness of 30 nm to 200 nm. The gate oxide films can be formed with the same photo-mask among those of an equal film thickness. Thus, the arrangement to made the gate oxide film thickness of the nonvolatile memory transistors with the single layer gate structure and the gate oxide film thickness of the MIS transistors in the other circuits into one uniform thickness provides the nonvolatile memory transistors of the flash memory with a somewhat longer information holding performance, while not complicating the manufacturing process of the system LSI.

Figure 18:
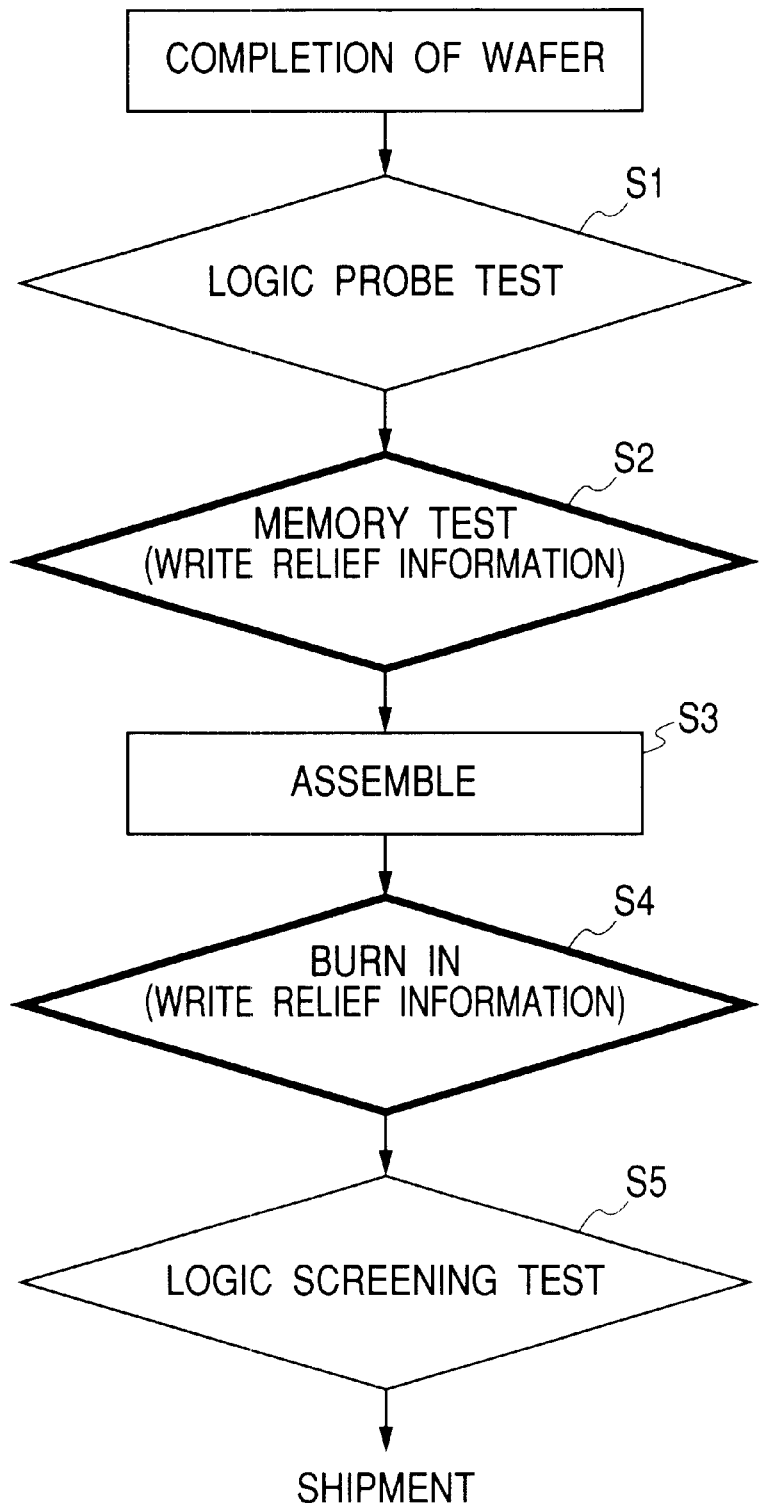
FIG. 18 is a process flow diagram of a testing flow for the system LSI shown in FIG. 17.

FIG. 18 illustrates a testing flow for the system LSI shown in FIG. 17. After completion of a wafer, at first, step S1 carries out a logic circuit test using a logic tester. To the chips that have passed the test, step S2 carries out a memory test. The memory test is performed by means of self-diagnosis by a built-in self-test (BIST) circuit installed on the chip, which is not illustrated. The obtained defective information is written in the nonvolatile memories (FUSE) 162, 163 as relief information, and the written information enables the relief of defects. Next, step S3 carries out assembling, in a specific package, of the chip that has completed the writing of relief information for relieving the memory; and step S4 carries out the operation test with the temperature and the supply voltage accelerated (bum-in test). If, in the burn-in test, there refresh defects and the like occur in the memory cells of the DRAM, the step carries out a second relief that replaces the defective bits by redundant bits, and writes the relief information into the nonvolatile memories (FUSE) 162, 163. And then, step S5 per forms the screening test of the logic circuit and the grading of the operation speed and so forth, before shipment.

As mentioned above, the employment of the single gate process, such as the single polysilicon gate process, also makes it possible to produce a semiconductor integrated circuit, such as a system LSI, that incorporates nonvolatile memories that are excellent in their data holding performance together with a DRAM and so forth. Further, since a high-reliability nonvolatile memory module can be formed without adding any process to the conventional standard CMOS manufacturing process, the application of the process to an LSI that incorporates a nonvolatile memory and a logic LSI or a nonvolatile memory and a DRAM on one and the same substrate is easy. Therefore, a system LSI incorporating a nonvolatile memory can iDe provided without increasing the manufacturing cost.

Relief Fuse Hybrid in DRAM

Figure 19:
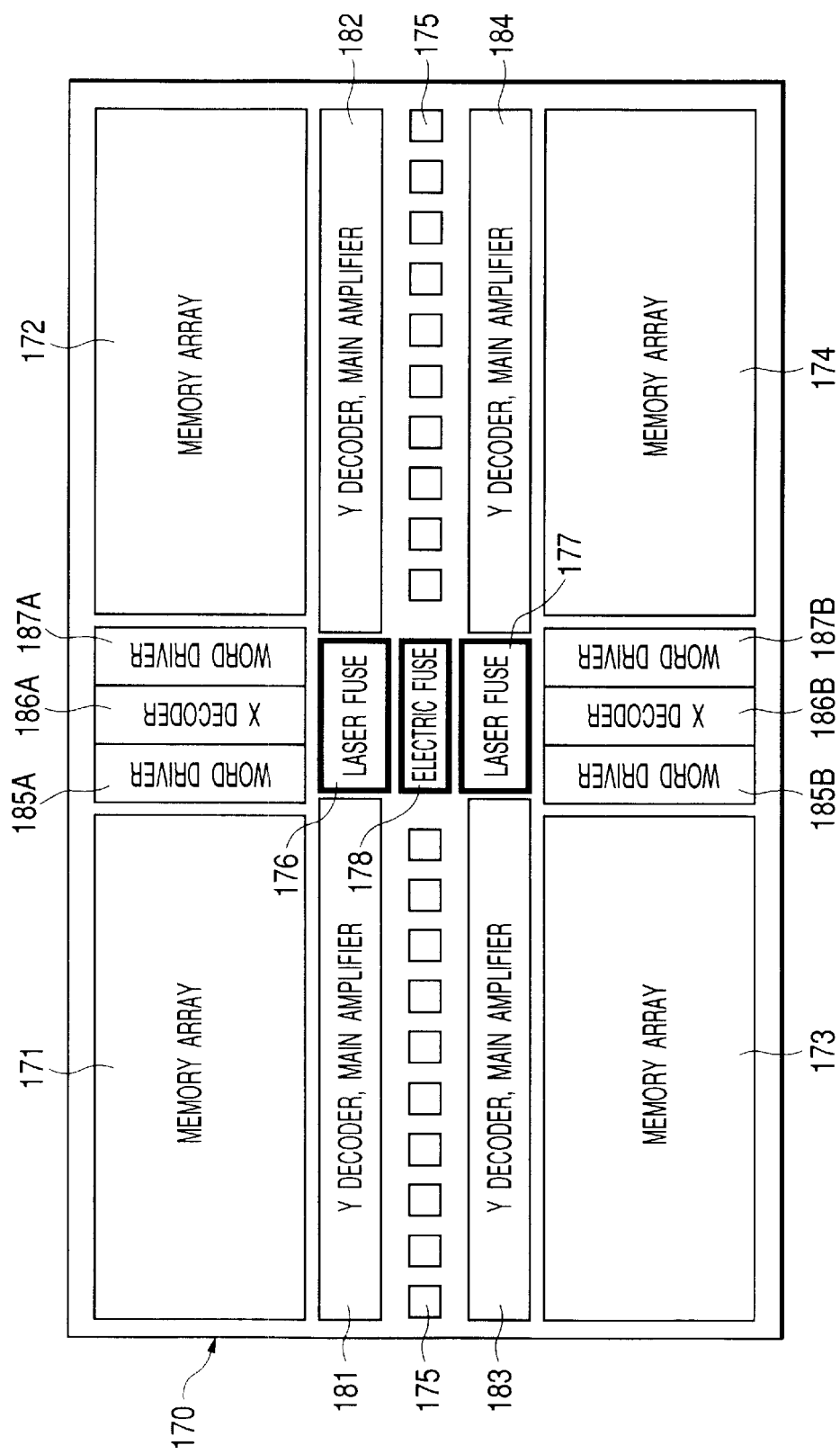
FIG. 19 is a schematic plan view of a chip of a 1 G bit DRAM representing one example of the semiconductor integrated circuit relating to the invention.

FIG. 19 illustrates a schematic plane configuration of a 1 G bit DRAM 170 representing one example of the semiconductor integrated circuit related to the invention. Memory arrays 171 to 174 are made up of four banks, and bonding pads 175 are arrayed on the center. As illustrated by the numeric symbols 181 to 184, each of the memory arrays 171 to 174 has a Y decoder and a main amplifier. The memory arrays 171, 172 share a word driver 185A, an X decoder 186A and a word driver 187A; and the memory arrays 173, 174 share a word driver 185B, an X decoder 186B and a word driver 187B.

The relief fuse contains two sets of 2000 laser fuses indicated by the numeric symbols 176, 177 and an electric fuse composed of a 100-bit nonvolatile memory, indicated by the numeric symbol 178, and these fuses are disposed at the center of the chip. The electric fuse 178 is configured with the self-latch type nonvolatile memory circuit, as described with reference to FIG. 1 and FIG. 4 and the like.

Figure 20:
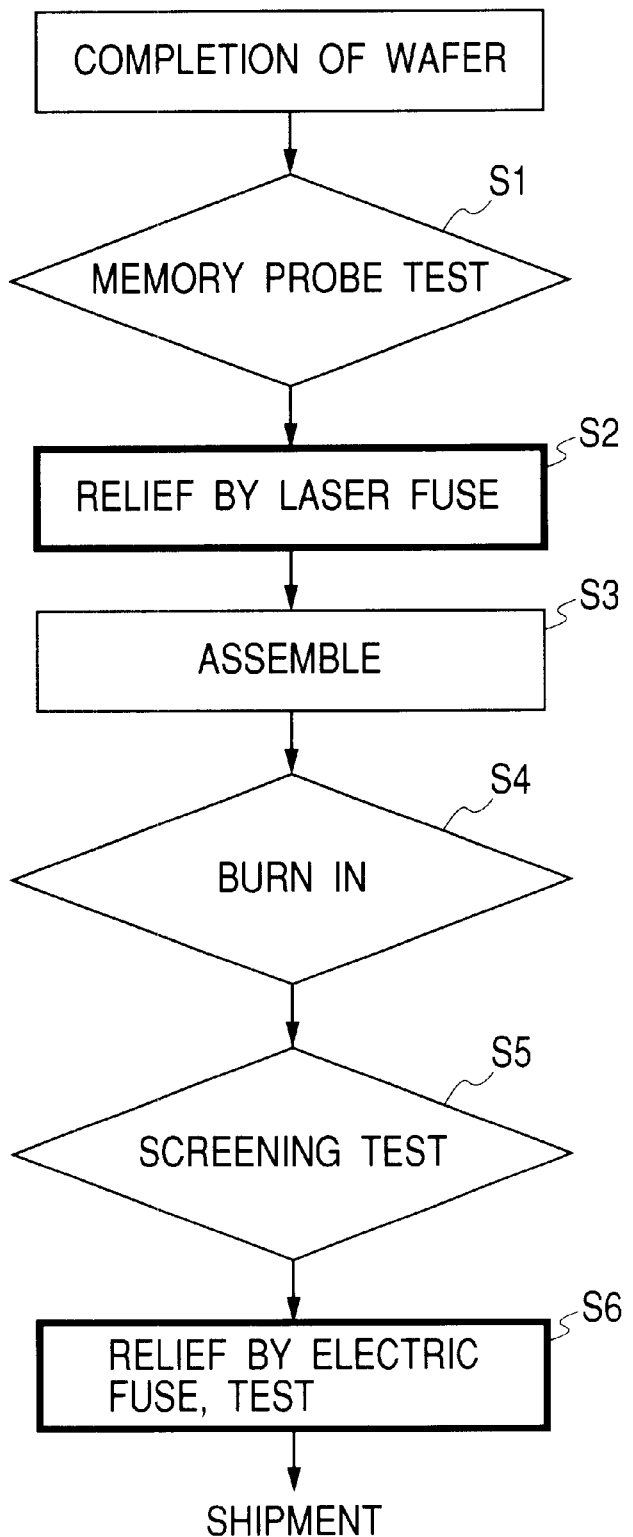
FIG. 20 is a process flow diagram of a testing flow for the DRAM shown in FIG. 19.

FIG. 20 illustrates a testing flow for the DRAM 170. After completion of a wafer, at first, step S1 carries out a memory test using a memory tester. To the defective bits found, step S2 carries out relief using the laser fuses for replacing redundant bits or redundant mats. Next, step S3 carries out assembling in a specific package; step S4 carries out a burn-in test as an operation test with the temperature and the supply voltage accelerated; and step S5 performs a screening test. If, in the burn-in test (S4), refresh defects and the like occur in the memory cells of the DRAM 170, step S6 writes the relief information into the electric fuse 178, as a second relief using the electric fuse that replaces the defective bits with the redundant bits. After this relief by the electric fuse, the step S6 carries out a memory test of the relieved addresses, before shipment.

Memory Having Flash Fuse Module

Figure 21:
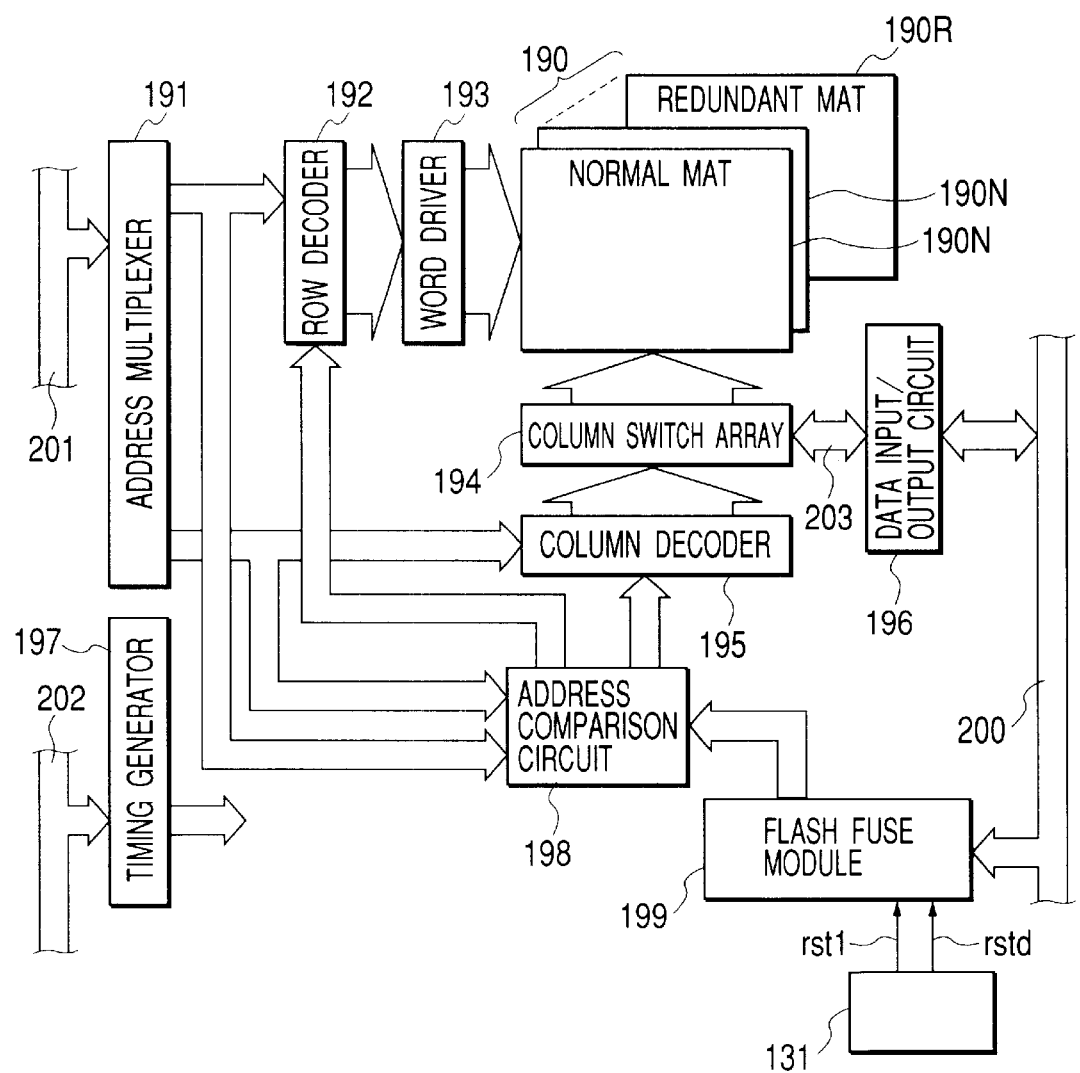
FIG. 21 is a block diagram illustrating a memory furnished with a flash fuse module.

FIG. 21 illustrates a memory provided with a nonvolatile memqry for storing relief addresses (hereunder, simply ref erred to as a flash fuse module). The memory in the drawing can be used, for example, for the DRAM 154 or the cache memory 156 made up with an SRAM, that are built in the system LSI in FIG. 17, and this memory is interfaced with a data bus 200, an address bus 201, and a control bus 202 that are connected to the CPU 155.

A memory cell array 190 possesses normal mats 190N defined as the to-be-relieved circuit and redundant mats 190R defined as the relief circuit, and these mats 190N, 190R have plural memories arrayed in the form of a matrix. The selection terminals of the memory cells are connected to the corresponding word lines, and the data input/output terminals thereof are connected to the corresponding data lines. The memory cells are dynamic memory cells or static memory cells. In the case of dynamic memory cells, a sensing amplifier is coupled with one terminal of the complementary data line in the shuttle data line structure.

Arow decoder 192 decodes a row address signal supplied from an address multiplexer 191 to generate a word line selection signal, which causes a word driver 193 to drive a word line to be selected to a selection level. A column decoder 195 decodes a column address signal supplied from the address multiplexer 191 to generate a column selection signal, which causes a column switch array 194 to select the complementary data line to be selected, and conducts it to a common data line 203. The read data from the memory cells selected in the reading operation are outputted to the data bus 200 from the common data line 203 through a data input/output circuit 196; and the write data to the memory cells selected in the writing operation are given to the common data line 203 through the data input/output circuit 196 from the data bus 200. The data input/output circuit 196 has a sensing amplifier that amplifies the read data in the SRAM, and a main amplifier that amplifies the read data in the DRAM. A timing generator 197 generates the internal timing signals required for the memory operation.

A flash fuse module 199 is a nonvolatile memory capable of storing relief address information in the nonvolatile memory circuit, described with reference to FIG. 2 and FIG. 9, and carries out storing of the relief address information by way of the data bus 200. The readout control of the relief address information applied to the nonvolatile circuit is carried out in response to the reset operation of the system LSI described with reference to FIG. 5.

An address comparison circuit 198 compares a row address and a column address supplied from the address multiplexer 191 with relief address information received from the flash fuse module 199. If the result is coincident, the address comparison circuit 198 will provide the row decoder 192 and the column decoder 195 with replacement address control information for replacing the accessing address to the defective normal mat 190N by the accessing address to the redundant mat 190R. The replacement address control information is, for example, the control information that replaces the address information of plural bits regarded as the mat selection signal among the address signals by the address information of plural bits regarded as the selection signal of the redundant mat 190R.

ECC Built-in Flash Fuse Module

Figure 22:
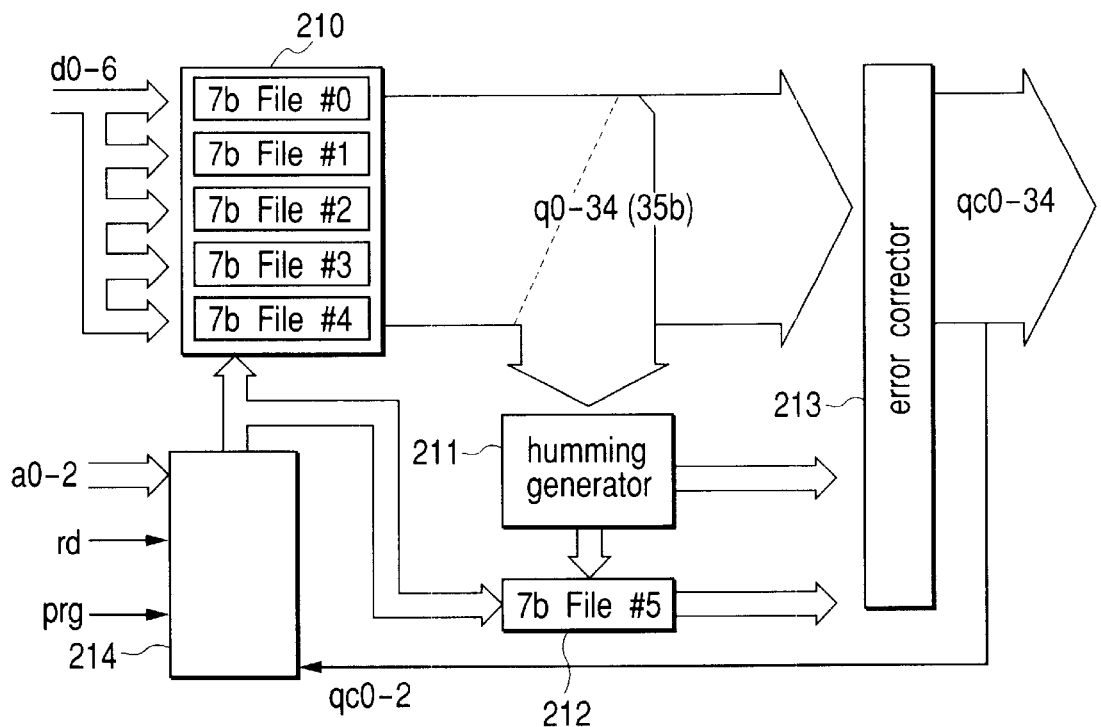
FIG. 22 is a block diagram of a flash fuse module illustrating another example of the semiconductor integrated circuit relating to the invention.

FIG. 22 illustrates a block configuration of a flash fuse module representing another example of a semiconductor integrated circuit related to the invention. The flash fuse module in the drawing includes a nonvolatile memory 210 having five nonvolatile memory blocks (7*b*File#0 to 7*b*File#4) operating as a nonvolatile information storage cell group, a humming code generator 211 that generates a humming code to data q0–34 of 35 bits outputted from the nonvolatile memory 210, a nonvolatile memory 212 having a nonvolatile memory block (7*b*File#5) that stores the humming code generated by the humming code generator 211, an error-correcting circuit 213 that inputs the humming code outputted from the nonvolatile memoxy 212 and the data q0–34 of 35 bits outputted from the nonvolatile memory 210 to correct the errors of the input data, and a control circuit 214. Write-in data d0–6 are supplied to the nonvolatile memory 210 the from outside. The output of the error-correcting circuit 213 is shown as qc0–34. The control circuit 214 receives address signals a0–2 for selecting the nonvolatile memory blocks 7*b*File#0 to 7*b*File#4, an instruction signal rd for reading, and an instruction signal prg for writing.

Figure 24:
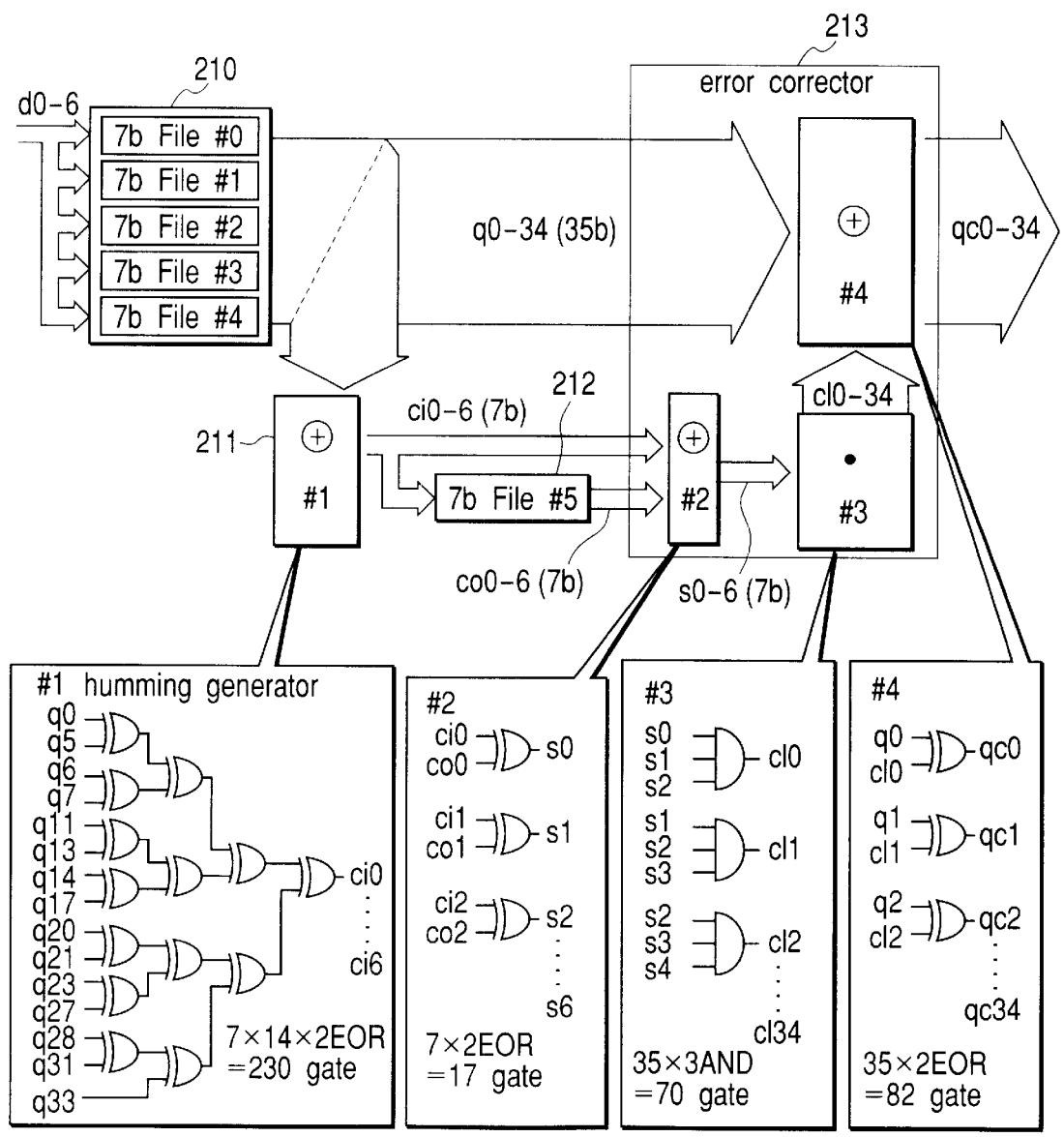
FIG. 24 is a diagram illustrating one example of the hamming code generation logic by a hamming code generator.
Figure 25:
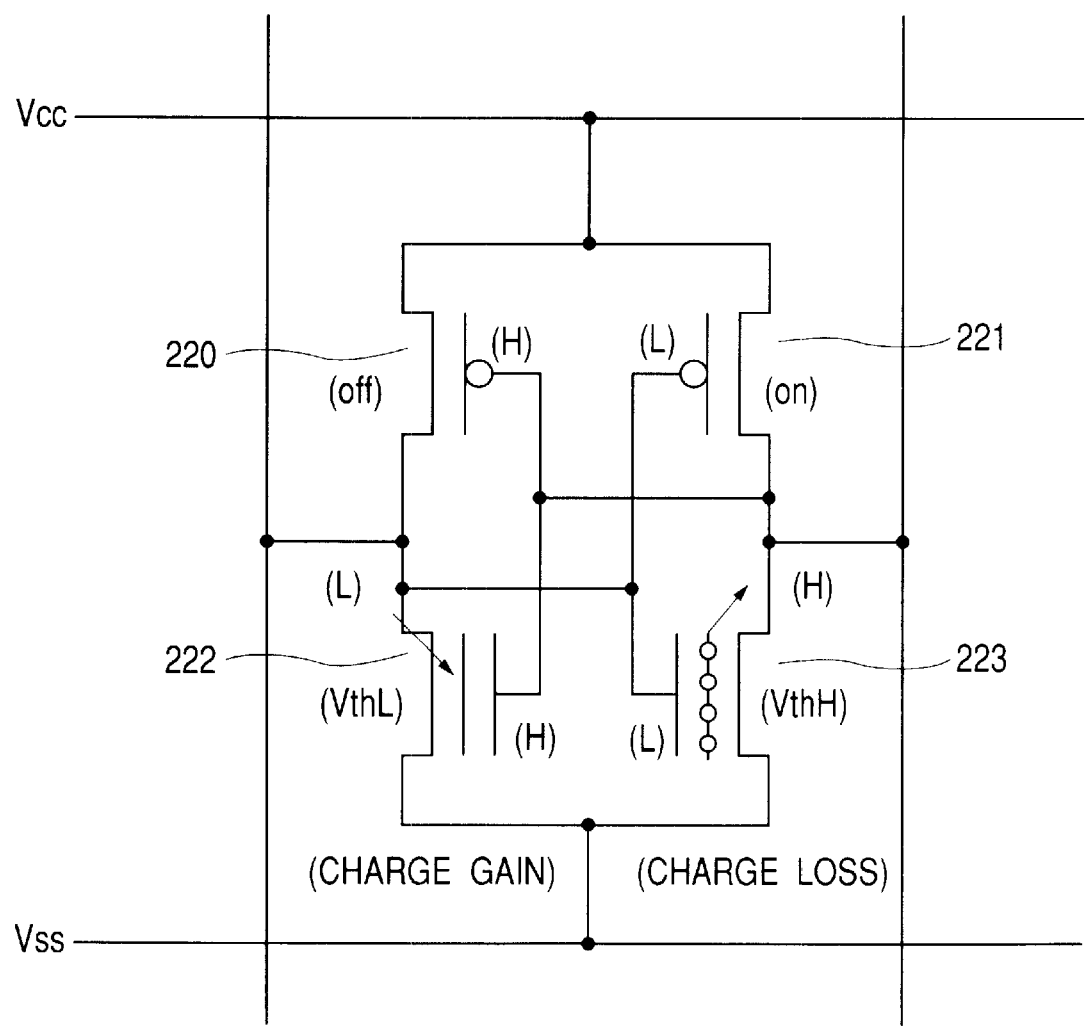
FIG. 25 is a circuit diagram of a flip-flop circuit including the nonvolatile memory transistor that the inventors of the present invention examined.

FIG. 24 illustrates one example of the hamming code generation logic used by the hamming code generator 211, and one example of the error detection and error correction logic used by the error-correcting circuit 213.

Figure 23:
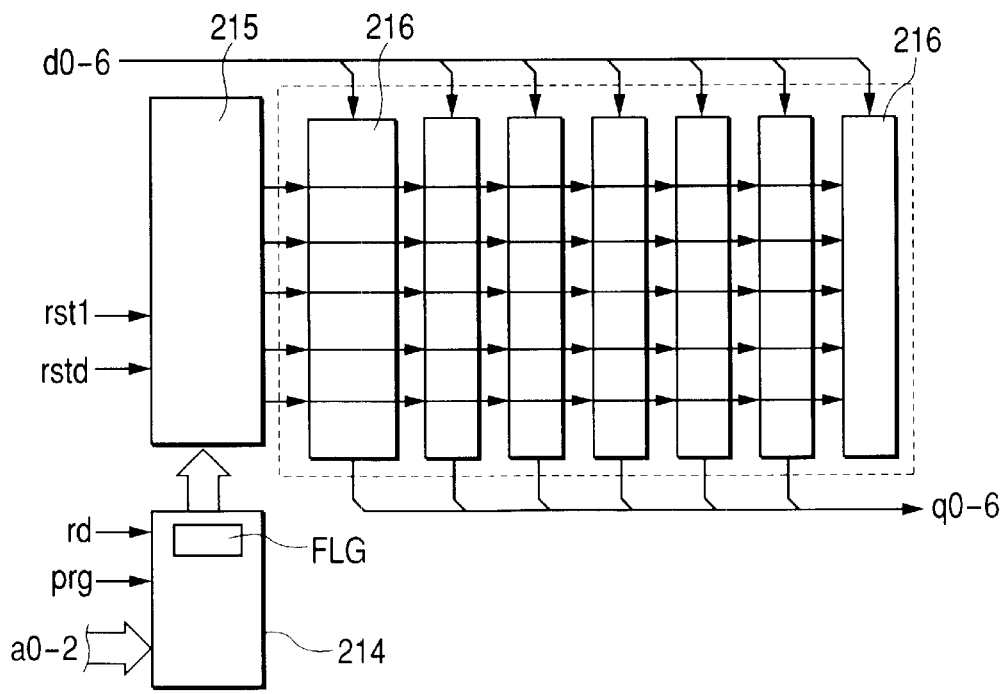
FIG. 23 is a block diagram illustrating one example of the nonvolatile memory blocks 7bFile#0 to 7bFile#5 that are contained in the flash fuse module.

FIG. 23 illustrates a circuit example of the nonvolatile memory blocks 7*b*File#0 to 7*b*File#5. Each of the nonvolatile memory blocks has a unit information cell of 216 by 7 bits that is configured mutually equally. The unit information cell 216 is a combination of one nonvolatile memory circuit and the volatile static latch that latches the output thereof. A bias controller 215 controls the unit information cell 216. The bias controller 215 executes the write-in and verification control to the unit information cell 216 on the basis of the instruction from the control circuit 214, and the logic control that implements the automatic power-off function by the readout control circuit 103. The bias controller 215 accepts the initialization signal rstl and the delay initialization signal rstd for implementing the automatic power-off function, and executes the automatic power-off control. The signal rd inputted to the control circuit 214 is the read instruction signal for verification, and the signal prg is the program signal. A program inhibit flag FLG is set or reset by the external circuit, such as a CPU. In the set state of the flag FLG, the write-in control circuit contained in the control circuit 214 is brought into an operation mode that inhibits the program operation to the nonvolatile memory circuit of the unit information cell 216. Therefore, after the necessary data are programmed in the nonvolatile memory blocks 7*b*File#0 to 7*b*File#5, an unspecified rewriting of the data can be reduced or restricted; and thereby the guarantee of the error correction function by the error-correcting circuit 213 can easily be achieved.

The invention has been described specifically in accordance with the preferred embodiments, however it is natural that the invention is not confined to the described embodiments, but various modifications and changes are possible without departure from the scope and the spirit thereof.

The nonvolatile memory circuit can be widely applied to other applications than the storage of relief information, for example, the nonvolatile memory transistors and so forth that constitute a programmable logic. The number of the series connection steps of the nonvolatile memory transistors is not limited to two, but it may be more than that. The relation between the writing and the erasing to the nonvolatile memory transistors is a relative concept; and the injection of electrons into the floating gate may be defined as erasing contrary to the above. In any case, the threshold control of the nonvolatile memory transistors can generally be conceived as the programming. It is possible to carry out the automatic power-off control by using a timer counter built in the system LSI, or by using a dedicated counter circuit. Further, the operating voltages for the writing, erasing, and reading to the nonvolatile memory transistors are not limited to the foregoing descriptions, but they may be modified appropriately. The semiconductor device relating to the invention is not limited to a system LSI, a microcomputer and so forth; but it may be applied to a relief circuit of a unit memory LSI of a DRAM, SRAM, etc.

The typical effects that the invention displays are as follows.

The semiconductor device of the invention reads out information stored in the nonvolatile memory transistors connected in the static latch configuration, such as a flip-flop (self-latch), and immediately thereafter stops applying the operating voltage to the nonvolatile memory transistors, thereby shortening the period of the voltage applied and enhancing the information holding performance over a long term.

The nonvolatile memory circuit employs a plurality of nonvolatile memory transistors having a single layer polysilicon gate structure in the configuration of series connection; therefore, it is possible to simplify the device structure of a nonvolatile memory transistors connected in the static latch configuration, which makes it possible to provide a semiconductor device incorporating a nonvolatile memory that remarkably reduces the rate of occurrence of readout defects, without adding a new process at all to the normal logic circuit process or the general purpose DRAM process.

The volatile data latch circuit holds data read from the nonvolatile memory transistors, and the error code correcting circuit processes the data held by the data latch circuit, which further enhances the reliability of the information stored accordingly.

We claim:

1. A semiconductor device having a nonvolatile memory on a semiconductor substrate, wherein the nonvolatile memory comprises:
   a plurality of nonvolatile memory circuits that include a pair of series circuits each of which includes a load element and a nonvolatile memory transistor connected in series, said pair of series circuits being connected in a static latch configuration;

a write-in control circuit that writes information into a plurality of the nonvolatile memory circuits;

a volatile latch circuit that latches information read from the nonvolatile memory circuits; and a readout control circuit that makes the volatile latch circuit latch the information read from the nonvolatile memory circuits, further comprising an ECC circuit that inputs information latched by the volatile latch circuit to correct errors.

2. A semiconductor device according to claim 1, wherein the readout control circuit supplies an operating supply voltage for a static latch operation to a plurality of the nonvolatile memory circuits in response to an instruction of a reading operation, and stops supplying the operating supply voltage, after the volatile latch circuit completes the latch operation in response to the static latch operation.

3. A semiconductor device according to claim 2, wherein the instruction of the reading operation is given in response to a reset instruction to the semiconductor device.

4. A semiconductor device according to claim 1, wherein:

the load elements included in each of the plural nonvolatile memory circuits are a first conductive type load transistor having a source, a drain, and a gate, and the nonvolatile memory transistors are a second conductive type transistor having a source, a drain, a floating gate, and a control gate;

the series circuit including the load transistor and the nonvolatile memory transistor includes an output node to couple the load transistor with the nonvolatile memory transistor, and a control node to couple the gate of the load transistor with the control gate of the nonvolatile memory transistor;

the output node of one series circuit of a pair of the series circuits is connected to the control node of the other series circuit to form the static latch configuration; and complementary data lines are connected to a pair of the output nodes of a pair of the series circuits.

5. A semiconductor device according to claim 1, wherein:

the load elements included in each of the plural nonvolatile memory circuits are a first conductive type load transistor having a source, a drain, and a gate, and the nonvolatile memory transistors are a second conductive type transistor having a source, a drain, a floating gate, and a control gate;

the series circuit including the load transistor and the nonvolatile memory transistor includes an output node to couple the load transistor with the nonvolatile memory transistor, a program node to connect another nonvolatile memory transistor in series to the nonvolatile memory transistor coupled with the output node, and a control node to commonly couple the gate of the load transistor and the control gate of the nonvolatile memory transistor;

a pair of the series circuits has a static latch configuration in which the output node of one series circuit is mutually connected to the control node of the other series circuit; and complementary data lines are connected to the output nodes of both the series circuits, and complementary program control lines are connected to the program nodes of both the series circuits.

6. A semiconductor device according to claim 1, wherein the nonvolatile memory transistor includes a MIS transistor having a second conductive type source and drain formed in a first conductive type semiconductor region, a gate insulating film formed on a channel between the source and the drain, and a floating gate formed on the gate insulating film, and a control gate being the second conductive type semiconductor region, underlying a gate insulating film formed beneath an extended portion of the floating gate.

7. A semiconductor device according to claim 1, wherein MIS transistors contained in the plurality of nonvolatile memory circuits and the write-in control circuit are the MIS transistor for use in a high voltage operation, and the MIS transistors contained in the volatile latch circuit and the readout control circuit are the MIS transistor for use in a low voltage operation.

8. A semiconductor device according to claim 6 or claim 7, further comprising a logic circuit and an external interface circuit each having the MIS transistors on the semiconductor substrate, wherein the gate insulating film of the nonvolatile memory transistors and the gate insulating film of the MIS transistors contained in the external interface circuit have a substantially equal thickness.

9. A semiconductor device according to claim 1 or claim 7, further comprising a logic circuit and an external interface circuit each having the MIS transistors on the semiconductor substrate, wherein the gate insulating film of the nonvolatile memory transistors is formed thicker than the gate insulating film of the MIS transistors contained in the logic circuit.

10. A semiconductor device according to claim 1, comprising on the substrate a to-be-relieved circuit and a relief circuit that replaces the to-be-relieved circuit, wherein the nonvolatile memory circuit stores relief information that specifies the to-be-relieved circuit to be replaced by the relief circuit.

11. A semiconductor device according to claim 10, further comprising a fuse programming circuit that stores the relief information in accordance with a fusing state of a fuse element, as another circuit to store the relief information for the to-be-relieved circuit.

12. A semiconductor device according to claim 10 or claim 11, wherein the to-be-relieved circuit is a memory cell array of a DRAM chip.

13. A semiconductor device according to claim 10 or claim 11, wherein the to-be-relieved circuit is a memory cell array of a microcomputer built-in DRAM.

14. A semiconductor device according to claim 10 or claim 11, wherein the to-be-relieved circuit is a memory cell array of a microcomputer built-in SRAM.

15. A semiconductor device according to claim 10 or claim 11, wherein a part of the plural nonvolatile memory circuits is served as a region to hold error correction codes of the relief information that the remaining nonvolatile memory circuits hold, and includes an ECC circuit capable of error corrections relating to readout information of the plural nonvolatile memory circuits.

16. A semiconductor device according to claim 15, wherein the write-in control circuit has an operation mode that inhibits a write-in operation to the nonvolatile memory circuits.

17. A semiconductor device having a nonvolatile memory on a semiconductor substrate, wherein the nonvolatile memory comprises a plurality of nonvolatile memory circuits including a pair of series circuits that include load elements and plural nonvolatile memory transistors, which are connected in a static latch configuration, further comprising a volatile latch circuit that latches information read from the nonvolatile memory circuits and an ECC circuit that inputs information latched by the volatile latch circuit to correct errors.

18. A semiconductor device according to claim 17, wherein:

the load elements included in each of the plural nonvolatile memory circuits are a first conductive type load transistor having a source, a drain, and a gate, and the nonvolatile memory transistors are a second conductive type transistor having a source, a drain, a floating gate, and a control gate;

the series circuit including the load transistor and the nonvolatile memory transistor includes an output node to couple the load transistor with the nonvolatile memory transistor, a program node to connect another nonvolatile memory transistor in series to the nonvolatile memory transistor coupled with the output node, and a control node to commonly couple the gate of the load transistor and the control gate of the nonvolatile memory transistor;

a pair of the series circuits has a static latch configuration in which the output node of one series circuit is mutually connected to the control node of the other series circuit; and complementary data lines are connected to the output nodes of both the series circuits, and complementary write-in control lines are connected to the control nodes of both the series circuits.

19. A semiconductor device according to claim 17, wherein the nonvolatile memory transistor includes a MIS transistor having a second conductive type source and drain formed in a first conductive type semiconductor region, a gate insulating film formed on a channel between the source and the drain, and a floating gate formed on the gate insulating film, and a control gate being the second conductive type semiconductor region, underlying a gate insulating film formed beneath an extended portion of the floating gate.

20. A semiconductor device according to claim 17, comprising on the substrate a to-be-relieved circuit and a relief circuit that replaces the to-be-relieved circuit, wherein the nonvolatile memory circuit stores relief information that specifies the to-be-relieved circuit to be replaced by the relief circuit.

21. A semiconductor device comprising:
a memory circuit including a first load element and a first nonvolatile transistor that are connected in series, and a second load element and a second nonvolatile transistor that are connected in series; and
a hold circuit that holds information read from the memory circuit,
wherein the first nonvolatile transistor has a control terminal connected to a node that couples the second load element and the second nonvolatile transistor,
wherein the second nonvolatile transistor has a control terminal connected to a node that couples the first load element and the first nonvolatile transistor,
wherein the hold circuit is connected to the node coupling the first load element and the first nonvolatile transistor and the node coupling the second load element and the second nonvolatile transistor, and
wherein each of the first and second nonvolatile transistors includes a MIS transistor having a second conductive type source and drain formed in a first conductive type semiconductor region, a gate insulating film formed on a channel between the source and the drain, and a floating gate formed on the gate insulating film, and a control gate being the second conductive type semiconductor region, underlying a gate insulating film formed beneath an extended portion of the floating gate,
further comprising an ECC circuit that inputs information held by the hold circuit to correct errors.

22. A semiconductor device comprising:
a memory circuit including a first load element and a first nonvolatile transistor that are connected in series, and a second load element and a second nonvolatile transistor that are connected in series; and
a hold circuit that holds information read from the memory circuit,
wherein the first nonvolatile transistor has a control gate connected to a node that couples the second load element and the second nonvolatile transistor,
wherein the second nonvolatile transistor has a control gate connected to a node that couples the first load element and the first nonvolatile transistor,
wherein the hold circuit is connected to the node coupling the first load element and the first nonvolatile transistor and the node coupling the second load element and the second nonvolatile transistor, and
wherein each of the first and second nonvolatile transistors includes a source and drain formed in a semiconductor region of a semiconductor substrate, an insulating film formed on a channel region in the semiconductor region, a floating gate formed on the insulating film, and a control gate formed in the semiconductor region,
further comprising an ECC circuit that inputs information held by the hold circuit to correct errors.

23. A semiconductor device according to claim 22, further comprising a plurality of memory cells, wherein the memory circuit is used to store relief addresses of the plural memory cells.

24. A semiconductor device according to claim 22, wherein the first and the second nonvolatile transistors are EEPROM memory cells.

25. A semiconductor device according to claim 22, wherein the hold circuit is a latch circuit.

26. A semiconductor device according to claim 22, wherein the first and the second load elements are MIS transistors.

27. A semiconductor device having a nonvolatile memory on a semiconductor substrate, wherein the nonvolatile memory comprises:
a plurality of nonvolatile memory circuits that include a pair of series circuits each of which includes a load element and a nonvolatile memory transistor connected in series, said pair of series circuits being connected in a static latch configuration;
a write-in control circuit that writes information into a plurality of the nonvolatile memory circuits;
a volatile latch circuit that latches information read from the nonvolatile memory circuits; and
a readout control circuit that makes the volatile latch circuit latch the information read from the nonvolatile memory circuits,
wherein MIS transistors contained in the plurality of nonvolatile memory circuits and the write-in control circuit are the MIS transistor for use in a high voltage operation, and the MIS transistors contained in the volatile latch circuit and the readout control circuit are the MIS transistor for use in a low voltage operation.

28. A semiconductor device according to claim 27, further comprising a logic circuit and an external interface circuit each having the MIS transistors on the semiconductor substrate, wherein the gate insulating film of the nonvolatile memory transistors and the gate insulating film of the MIS transistors contained in the external interface circuit have a substantially equal thickness.

29. A semiconductor device having a nonvolatile memory on a semiconductor substrate, wherein the nonvolatile memory comprises:
- a plurality of nonvolatile memory circuits that include a pair of series circuits each of which includes a load element and a nonvolatile memory transistor connected in series, said pair of series circuits being connected in a static latch configuration;
- a write-in control circuit that writes information into a plurality of the nonvolatile memory circuits;
- a volatile latch circuit that latches information read from the nonvolatile memory circuits; and
- a readout control circuit that makes the volatile latch circuit latch the information read from the nonvolatile memory circuits,
- further comprising a logic circuit and an external interface circuit each having MIS transistors on the semiconductor substrate, wherein the gate insulating film of the nonvolatile memory transistors is formed thicker than the gate insulating film of the MIS transistors contained in the logic circuit.

30. A semiconductor device having a nonvolatile memory on a semiconductor substrate, wherein the nonvolatile memory comprises:
- a plurality of nonvolatile memory circuits that include a pair of series circuits each of which includes a load element and a nonvolatile memory transistor connected in series, said pair of series circuits being connected in a static latch configuration;
- a write-in control circuit that writes information into a plurality of the nonvolatile memory circuits;
- a volatile latch circuit that latches information read from the nonvolatile memory circuits; and
- a readout control circuit that makes the volatile latch circuit latch the information read from the nonvolatile memory circuits;
- further comprising, on the substrate, a to-be-relieved circuit and a relief circuit that replaces the to-be-relieved circuit, wherein the nonvolatile memory circuit stores relief information that specifies the to-be-relieved circuit to be replaced by the relief circuit.

31. A semiconductor device according to claim 30, further comprising a fuse programming circuit that stores the relief information in accordance with a fusing state of a fuse element, as another circuit to store the relief information for the to-be-relieved circuit.

32. A semiconductor device according to claim 30 or claim 31, wherein the to-be-relieved circuit is a memory cell array of a DRAM chip.

33. A semiconductor device according to claim 30 or claim 31, wherein the to-be-relieved circuit is a memory cell array of a microcomputer built-in DRAM.

34. A semiconductor device according to claim 30 or claim 31, wherein the to-be-relieved circuit is a memory cell array of a microcomputer built-in SRAM.

35. A semiconductor device according to claim 30 or claim 31, Wherein a part of the plural nonvolatile memory circuits is served as a region to hold error correction codes of the relief information that the remaining nonvolatile memory circuits hold, and includes an ECC circuit capable of error corrections relating to readout information of the plural nonvolatile memory circuits.

36. A semiconductor device according to claim 35, wherein the write-in control circuit has an operation mode that inhibits a write-in operation to the nonvolatile memory circuits.

37. A semiconductor device having a nonvolatile memory on a semiconductor substrate, wherein the nonvolatile memory comprises a plurality of nonvolatile memory circuits including a pair of series circuits that include load elements and plural nonvolatile memory transistors, which are connected in a static latch configuration,
- further comprising, on the substrate, a to-be-relieved circuit and a relief circuit that replaces the to-be-relieved circuit, wherein the nonvolatile memory circuit stores relief information that specifies the to-be-relieved circuit to be replaced by the relief circuit.

* * * * *